(12) United States Patent
Yeom et al.

(10) Patent No.: US 11,809,651 B2
(45) Date of Patent: Nov. 7, 2023

(54) DISPLAY DEVICE AND METHOD FOR PROVIDING HAPTIC FEEDBACK BY DISPLAY DEVICE

(71) Applicant: Samsung Display Co., LTD., Yongin-si (KR)

(72) Inventors: Dong Yeol Yeom, Suwon-si (KR); Jung Ho Myung, Seoul (KR); Min Jeung Lee, Suwon-si (KR); Se Ryun Lee, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/397,361

(22) Filed: Aug. 9, 2021

(65) Prior Publication Data

US 2021/0373694 A1 Dec. 2, 2021

Related U.S. Application Data

(63) Continuation of application No. 16/735,676, filed on Jan. 6, 2020, now Pat. No. 11,086,431.

(30) Foreign Application Priority Data

Jan. 30, 2019 (KR) .......................... 10-2019-0012270
Jun. 7, 2019 (KR) .......................... 10-2019-0067534

(51) Int. Cl.
*G06F 3/041* (2006.01)
*G06F 3/01* (2006.01)
*H10N 30/20* (2023.01)

(52) U.S. Cl.
CPC ............ *G06F 3/0412* (2013.01); *G06F 3/016* (2013.01); *H10N 30/20* (2023.02)

(58) Field of Classification Search
None
See application file for complete search history.

(56) References Cited

U.S. PATENT DOCUMENTS

| | | | | |
|---|---|---|---|---|
| 5,436,622 A | * | 7/1995 | Gutman | ................... G08B 6/00 340/407.1 |
| 5,959,613 A | * | 9/1999 | Rosenberg | ............ A63F 13/285 345/157 |
| 6,420,965 B1 | * | 7/2002 | Edgren | ................. B06B 1/0284 340/407.1 |
| 9,984,539 B2 | * | 5/2018 | Moussette | ................. G06F 3/16 |
| 2008/0296072 A1 | * | 12/2008 | Takashima | .............. G06F 3/016 178/18.01 |

(Continued)

FOREIGN PATENT DOCUMENTS

| | | |
|---|---|---|
| KR | 1020070045954 | 5/2007 |
| KR | 1020130010865 | 1/2013 |
| KR | 1020130057200 | 5/2013 |

*Primary Examiner* — Matthew Yeung
(74) *Attorney, Agent, or Firm* — CANTOR COLBURN LLP

(57) ABSTRACT

A display device includes a display panel, a touch sensing layer which is disposed on a first surface of the display panel and senses a touch input of a user, a first vibration device which is disposed on a second surface of the display panel and generates vibration according to driving voltages. The first vibration device generates a first vibration in response to a first touch input of the user to provide a first haptic feedback.

12 Claims, 26 Drawing Sheets

| SITUATION | FREQUENCY (Hz) | AMPLITUDE | TIME PERIOD (ms) | NUMBER OF INCREASING AMPLITUDE | NUMBER OF DECREASING AMPLITUDE |
|---|---|---|---|---|---|
| COUNTDOWN BEFORE START | 46 | 52 | 298 | 4 | 4 |
| START | 62 | 66 | 736 | 0 | 0 |
| FIRST ACCELERATION ICON | 203 | 60 | 98 | 3 | 0 |
| SECOND ACCELERATION ICON | 203 | 60 | 201 | 5 | 0 |
| COLLISION | 148 | 50 | 47 | 1 | 1 |
| DRIFT | 46 | 52 | 725 | 1 | 1 |
| STOP | 15 | 59 | 2500 | 0 | 0 |

(56) References Cited

U.S. PATENT DOCUMENTS

| | | | |
|---|---|---|---|
| 2009/0292990 A1* | 11/2009 | Park | G06F 3/0485 715/830 |
| 2010/0188327 A1* | 7/2010 | Frid | G06F 3/016 340/407.2 |
| 2011/0148608 A1* | 6/2011 | Grant | G06F 1/1626 345/173 |
| 2012/0025742 A1* | 2/2012 | Masahiko | B06B 1/0207 318/114 |
| 2012/0306632 A1* | 12/2012 | Fleizach | G06F 3/0488 340/407.2 |
| 2013/0088439 A1* | 4/2013 | Shih | G06F 3/016 345/173 |
| 2013/0127759 A1* | 5/2013 | Bae | G06F 3/041 345/173 |
| 2014/0055358 A1 | 2/2014 | Birnbaum et al. | |
| 2014/0145994 A1 | 5/2014 | Burrough et al. | |
| 2014/0160040 A1 | 6/2014 | Kang et al. | |
| 2014/0210756 A1* | 7/2014 | Lee | G06F 3/03545 345/173 |
| 2014/0347322 A1* | 11/2014 | Kamata | G06F 3/016 345/174 |
| 2015/0009176 A1* | 1/2015 | Inata | G06F 1/1637 345/174 |
| 2015/0145657 A1 | 5/2015 | Levesque et al. | |
| 2015/0355712 A1 | 12/2015 | Rihn et al. | |
| 2016/0063828 A1* | 3/2016 | Moussette | G06F 3/0488 340/691.5 |
| 2017/0052593 A1 | 2/2017 | Jiang et al. | |
| 2019/0346926 A1* | 11/2019 | Kirisken | G06F 3/016 |

* cited by examiner

↑ POLARIZATION DIRECTION

FIG. 9

| SITUATION | FREQUENCY (Hz) | AMPLITUDE | TIME PERIOD (ms) | NUMBER OF INCREASING AMPLITUDE | NUMBER OF DECREASING AMPLITUDE |
|---|---|---|---|---|---|
| COUNTDOWN BEFORE START | 46 | 52 | 298 | 4 | 4 |
| START | 62 | 66 | 736 | 0 | 0 |
| FIRST ACCELERATION ICON | 203 | 60 | 98 | 3 | 0 |
| SECOND ACCELERATION ICON | 203 | 60 | 201 | 5 | 0 |
| COLLISION | 148 | 50 | 47 | 1 | 1 |
| DRIFT | 46 | 52 | 725 | 1 | 1 |
| STOP | 15 | 59 | 2500 | 0 | 0 |

FIG. 11

| EVENT | FREQUENCY (Hz) | AMPLITUDE | TIME PERIOD (ms) |
|---|---|---|---|
| TOUCH SINGLE KEY | 78 | 26 | 153 |
| TOUCH TWO KEYS SIMULTANEOUSLY | 109 | 32 | 109 |
| TOUCH THREE KEYS SIMULTANEOUSLY | 125 | 45 | 96 |

FIG. 13

| EVENT | FREQUENCY (Hz) | AMPLITUDE | TIME PERIOD (ms) |
|---|---|---|---|
| TOUCH PENCIL | 218 | 10 | 18 |
| TOUCH PEN | 203 | 23 | 19 |
| TOUCH ERASER | 78 | 36 | 51 |

FIG. 15

| EVENT | FREQUENCY (Hz) | AMPLITUDE | TIME PERIOD (ms) |
|---|---|---|---|
| TOUCH ENTER/SPACE | 148 | 97 | 26 |
| TOUCH LETTER/NUMBER | 156 | 84 | 6 |

FIG. 17

| EVENT | FREQUENCY (Hz) | AMPLITUDE | TIME PERIOD (ms) |
|---|---|---|---|
| DRAG VOLUME SLIDER | 78~195 | 10~60 | 10~25 |
| DRAG BRIGHTNESS SLIDER | 109 | 15~85 | 18 |
| DRAG COLOR SLIDER | 78~156 | 15~85 | 12 |
| DRAG ZOOM SLIDER | 125 | 15~40 | 16 |

FIG. 19

| GESTURE | FREQUENCY (Hz) | AMPLITUDE | TIME PERIOD (ms) | PERIOD IN WHICH AMPLITUDE IS INCREASED (ms) | PERIOD IN WHICH AMPLITUDE IS DECREASED (ms) |
|---|---|---|---|---|---|
| MAGNIFY IMAGE | 195 | 66 | 10 | 0 | 0 |
| REDUCE IMAGE | 125 | 60 | 16 | 0 | 0 |
| DRAG IMAGE TOWARD UPPER SIDE | 125 | 34 | 144 | 128 | 0 |
| DRAG IMAGE TOWARD LOWER SIDE | 125 | 34 | 144 | 0 | 124 |

DISPLAY DEVICE AND METHOD FOR PROVIDING HAPTIC FEEDBACK BY DISPLAY DEVICE

This application is a continuation of U.S. patent Ser. No. 16/735,676, filed on Jan. 6, 2020, which claims priority to Korean Patent Application No. 10-2019-0012270, filed on Jan. 30, 2019, and No. 10-2019-0067534, filed on Jun. 7, 2019, and all the benefits accruing therefrom under 35 U.S.C. § 119, the content of which in their entirety is herein incorporated by reference.

BACKGROUND

1. Field

Exemplary embodiments of the invention relate to a display device and a method for providing a haptic feedback.

2. Description of the Related Art

As an information-oriented society evolves, various demands for display devices are ever increasing. The display devices are being employed by a variety of electronic devices such as smart phones, digital cameras, laptop computers, navigation devices, and smart televisions.

The display devices may provide a haptic feedback to deliver tactile feedback to users. Display devices may include a vibration device to provide a haptic feedback.

SUMMARY

Since there is a vibration remaining after a display device provides a haptic feedback, a tactile quality felt by a user may deteriorate.

Exemplary embodiments of the invention provide a display device capable of improving a tactile quality felt by a user when a haptic feedback is provided.

Exemplary embodiments of the invention also provide a method for providing a haptic feedback by which a tactile quality felt by a user when a haptic feedback is provided may be improved.

An exemplary embodiment of the invention provides a display device including a display panel, a touch sensing layer which senses a touch input of a user, and a first vibration device which is disposed on a first surface of the display panel and generates vibration according to driving voltages. The first vibration device generates a first vibration in response to a first touch input of the user to provide a first haptic feedback.

In an exemplary embodiment, the first vibration device may generate a second vibration in response to a second touch input of the user to provide a second haptic feedback. The first vibration may be different from the second vibration.

In an exemplary embodiment, a first frequency of the first vibration may be different from a second frequency of the second vibration.

In an exemplary embodiment, a first amplitude of the first vibration may be different from a second amplitude of the second vibration.

In an exemplary embodiment, a first period of the first vibration may be different from a second period of the second vibration.

In an exemplary embodiment, when the second touch input is a multi-touch input, a second frequency of the second vibration may be higher than a first frequency of the first vibration, and a second amplitude of the second vibration may be greater than a first amplitude of the first vibration.

In an exemplary embodiment, the first vibration device may generate a third vibration in response to a third touch input of the user to provide a third haptic feedback. The third vibration may be different from the first vibration and the second vibration.

In an exemplary embodiment, when the second touch input includes two touch inputs and the third touch input includes three touch inputs, a third frequency of the third vibration may be higher than the second frequency of the second vibration, and a third amplitude of the third vibration may be greater than the second amplitude of the second vibration.

In an exemplary embodiment, an amplitude of the first vibration may be increased N times. N is a positive integer.

In an exemplary embodiment, an amplitude of the first vibration may be increased N times and decreased M times. N and M are positive integers.

In an exemplary embodiment, N may be equal to M.

In an exemplary embodiment, an amplitude of the first vibration may be decreased M times. M is a positive integer.

In an exemplary embodiment, each of the driving voltages may be a square wave.

In an exemplary embodiment, the first vibration device may include a first electrode to which a first driving voltage of the driving voltages is applied, a second electrode to which a second driving voltage of the driving voltages is applied, and a vibration layer between the first electrode and the second electrode and including a piezoelectric material that contracts or expands according to the first driving voltage applied to the first electrode and the second driving voltage applied to the second electrode.

An exemplary embodiment of the invention provides a display device including a display panel, a touch sensing layer which senses a touch input of a user, a first vibration device which is disposed on a first surface of the display panel and generates vibration according to driving voltages, and a second vibration device which is disposed on the first surface of the display panel and generates vibration according to the driving voltages. The first vibration device is closer to a first side of the display panel than the second vibration device is, and the second vibration device is closer to a second side of the display panel than the first vibration device is, and at least one of the first vibration device and the second vibration device generates vibration in response to the touch input to provide a first haptic feedback.

In an exemplary embodiment, the first vibration device may generate the vibration when the touch input is closer to the first vibration device than the second vibration device, and the second vibration device may generate the vibration when the touch input is closer to the second vibration device than the first vibration device.

In an exemplary embodiment, a mono sound may be output by the vibration of the first vibration device and the vibration of the second vibration device in a mono sound mode, and a first stereo sound may be output by the vibration of the first vibration device, and a second stereo sound may be output by the vibration of the second vibration device in a stereo sound mode.

An exemplary embodiment of the invention provides a method for providing a haptic feedback by a display device, and the method includes generating a first vibration, by a first vibration device disposed on a first surface of a display panel, in response to a first touch input of a user sensed by a touch sensing layer, and generating a second vibration, by the first vibration device, in response to a second touch input of the user, where the first vibration is different from the second vibration.

In an exemplary embodiment, a first frequency of the first vibration may be different from a second frequency of the second vibration.

In an exemplary embodiment, a first amplitude of the first vibration may be different from a second amplitude of the second vibration.

In an exemplary embodiment, a first period of the first vibration may be different from a second period of the second vibration.

In an exemplary embodiment of the invention, when a vibration device is a piezoelectric element or a piezoelectric actuator including a piezoelectric material, it includes no voice coil. Accordingly, compared with a linear resonant actuator that vibrates using a voice coil, there is an advantage that almost no vibration remains after the application of the first and second driving voltages is finished. Therefore, it is possible to improve the quality of a tactile feedback for a user in the haptic feedback.

In an exemplary embodiment, a display device and a method for providing a haptic feedback by a display device may provide a user with different haptic feedbacks according to the user's touch input in the application, thereby increasing the user's immersion into the application.

In an exemplary embodiment, a display device and a method for providing a haptic feedback by a display device may further improve the tactile quality felt by a user by way of providing a haptic feedback by a vibration device adjacent to the user's touch coordinates.

BRIEF DESCRIPTION OF THE DRAWINGS

The above and other exemplary embodiments and features of the invention will become more apparent by describing in detail embodiments thereof with reference to the attached drawings, in which:

FIG. 9 is a table showing an exemplary embodiment of a method for providing a haptic feedback by a display device according to the invention;

FIG. 11 is a table showing an exemplary embodiment of a method for providing a haptic feedback by a display device according to the invention;

FIG. 13 is a table showing an exemplary embodiment of a method for providing a haptic feedback by a display device according to the invention;

FIG. 15 is a table showing an exemplary embodiment of a method for providing a haptic feedback by a display device according to the invention;

FIG. 17 is a table showing an exemplary embodiment of a method for providing a haptic feedback by a display device according to the invention;

FIG. 19 is a table showing an exemplary embodiment of a method for providing a haptic feedback by a display device according to the invention;

DETAILED DESCRIPTION

Figure 1:
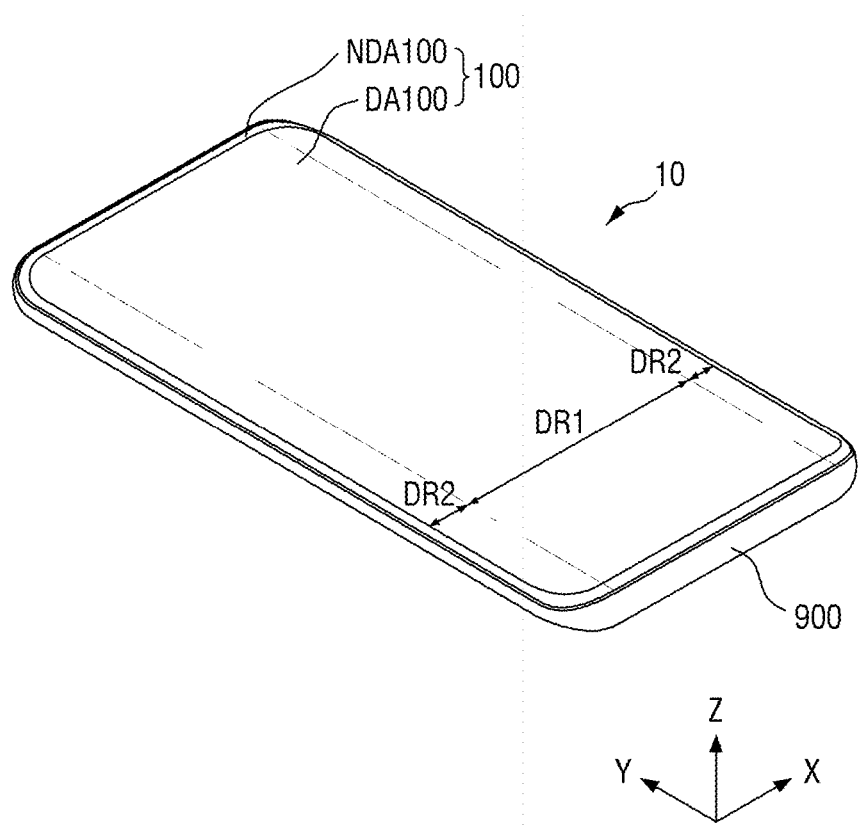
FIG. 1 is a perspective view of an exemplary embodiment of a display device according to the invention.

The invention will now be described more fully hereinafter with reference to the accompanying drawings, in which preferred embodiments of the invention are shown. The invention may, however, be embodied in different forms and should not be construed as limited to the exemplary embodiments set forth herein. Rather, these embodiments are provided so that this disclosure will be thorough and complete, and will filly convey the scope of the invention to those skilled in the art. The same reference numbers indicate the same components throughout the specification. In the attached drawing figures, the thickness of layers and regions is exaggerated for clarity.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region,"

"layer" or "section" discussed below could be termed a second element, component, region, layer or section without departing from the teachings herein.

It will also be understood that when a layer is referred to as being "on" another layer or substrate, it can be directly on the other layer or substrate, or intervening layers may also be present. In contrast, when an element is referred to as being "directly on" another element, there are no intervening elements present.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." "At least one of A and B" means "A and/or B." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Hereinafter, embodiments of the invention will be described with reference to the accompanying drawings.

Figure 2:
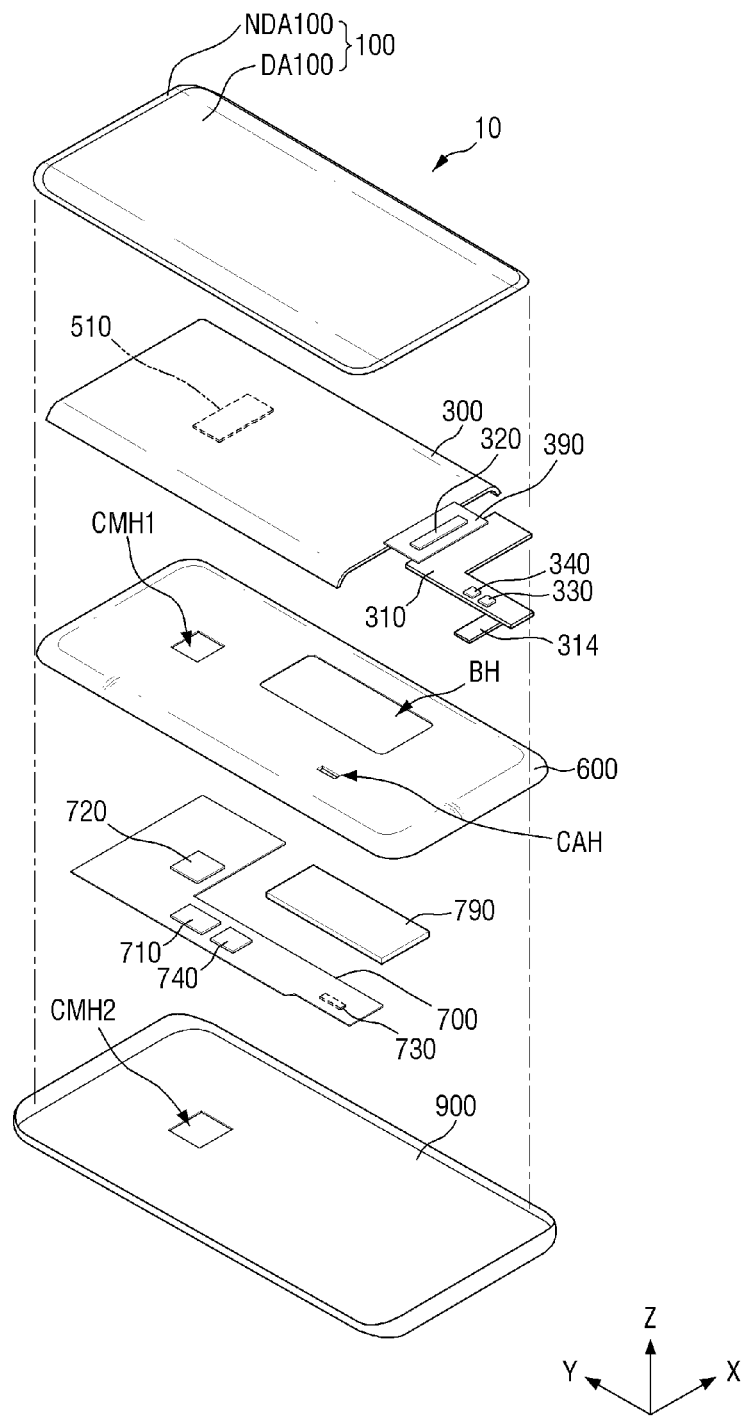
FIG. 2 is an exploded, perspective view of an exemplary embodiment of a display device according to the invention.

FIG. 1 is a perspective view of an exemplary embodiment of a display device according to the invention. FIG. 2 is an exploded, perspective view of an exemplary embodiment of a display device according to the invention.

Referring to FIGS. 1 and 2, a display device 10 in an exemplary embodiment of the invention includes a cover window 100, a display panel 300, a display circuit board 310, a display driving circuit 320, a flexible film 390, a vibration device 510, a bracket 600, a main circuit board 700, and a bottom cover 900.

As used herein, the term "upper side" refers to the side of the display panel 300 in the Z-axis direction where the cover window 100 is disposed, whereas the term "lower side" refers to the opposite side of the display panel 300 in the Z-axis direction where the bracket 600 is disposed. As used herein, the terms "left," "right," "upper" and "lower" sides indicate relative positions when the display panel 300 is viewed from the top. The "left side" refers to the opposite direction indicated by the arrow of the x-axis, the "right side" refers to the direction indicated by the arrow of the x-axis, the "upper side" refers to the direction indicated by the arrow of the z-axis, and the "lower side" refers to the opposite direction indicated by the arrow of the z-axis, for example.

The display device 10 may have a rectangular shape from the top. The display device 10 may have a rectangular shape including shorter sides in a first direction (X-axis direction) and longer sides in a second direction (Y-axis direction) from the top as shown in FIGS. 1 and 2, for example. Each of the corners where the short side in the first direction (X-axis direction) meets the longer side in the second direction (Y-axis direction) may be rounded with a predetermined curvature or may be a right angle. The shape of the display device 10 from the top is not limited to a rectangular shape, but may be provided in another polygonal shape, circular shape, or elliptical shape.

The display device 10 may include a first region DR1 which is provided flat, and a second region DR2 extended from the right and left sides of the first region DR1. The second region DR2 may be provided flat or may be curved. When the second region DR2 is provided flat, the angle provided by the first region DR1 and the second region DR2 may be an obtuse angle. When the second region DR2 is provided as a curved surface, it may have a constant curvature or a varying curvature.

Although the second areas DR2 are extended from the left and right sides of the first region DR1 in FIG. 1, this is merely illustrative. That is to say, the second region DR2 may be extended from only one of the right and left sides of the first region DR1. In an alternative exemplary embodiment, the second region DR2 may be extended from at least one of upper and lower sides of the first region DR1, as well as the left and right sides. In the following description, the second areas DR2 are disposed at the left and right edges of the display device 10, respectively.

The cover window 100 may be disposed on the display panel 300 to cover the upper surface of the display panel 300. Thus, the cover window 100 may protect the upper surface of the display panel 300.

The cover window 100 may include a transmissive portion DA100 corresponding to the display panel 300 and a non-transmissive portion NDA100 corresponding to the other area than the display panel 300. The cover window 100 may be disposed in the first region DR1 and the second regions DR2. The transmissive portion DA100 may be disposed in a part of the first region DR1 and a part of each of the second regions DR2. The non-transmissive portion NDA 100 may be opaque. In an alternative exemplary embodiment, the non-transmissive portion NDA 100 may be provided as a decoration layer having a pattern that may be displayed to the user when no image is displayed.

The display panel 300 may be disposed under the cover window 100. The display panel 300 may be disposed such that it overlaps with the transmissive portion 100DA of the cover window 100. The display panel 300 may be disposed in the first region DR1 and the second areas DR2. Therefore, the image on the display panel 300 may be seen not only in the first region DR1 but also in the second areas DR2.

The display panel 300 may be a light-emitting display panel including a light-emitting element. In an exemplary embodiment, the display panel 300 may be an organic light-emitting display panel using organic light-emitting diodes ("LEDs") including organic emissive layer, a micro LED display panel using micro LEDs, a quantum-dot light-emitting display panel including quantum-dot LEDs including an quantum-dot emissive layer, or an inorganic light-emitting display panel using inorganic light-emitting elements including an inorganic semiconductor, for example. In the following description, an organic light-emitting display panel is employed as the display panel 300.

The display circuit board 310 and the display driving circuit 320 may be attached to one side of the display panel 300. One side of the display circuit board 310 may be attached to pads disposed on one side of the display panel 300 using an anisotropic conductive film. In an exemplary embodiment, the display circuit board 310 may be a flexible printed circuit board ("FPCB") that may be bent, a rigid printed circuit board ("PCB") that is rigid and not bendable, or a hybrid printed circuit board including a rigid printed circuit board and an FPCB.

The display driving circuit 320 receives control signals and supply voltages through the display circuit board 310 and outputs signals and voltages for driving the display panel 300. In an exemplary embodiment, the display driving circuit 320 may be provided as, but is not limited to, an integrated circuit ("IC") and may be attached to the display circuit board 310. In an exemplary embodiment, the display driving circuit 320 may be attached to the display panel 300 by a chip on glass ("COG") technique, a chip on plastic ("COP") technique, or an ultrasonic bonding, for example.

A touch driver 330 and a vibration driver 340 may be disposed on the display circuit board 310. The touch driver 330 and the vibration driver 340 may be implemented as ICs.

The touch driver 330 may be attached to the upper surface of the display circuit board 310. The touch driver 330 may be electrically connected to sensor electrodes of a touch sensing layer of the display panel 300 through the display circuit board 310. In the mutual capacitance sensing method, the touch driver 330 may apply touch driving signals to the driving electrodes among the sensor electrodes and may sense changes in the charged amount of the capacitances between the driving electrodes and the sensing electrodes through the sensing electrodes among the sensor electrodes, to thereby determine whether a user made a touch or proximity touch. A user's touch refers to that an object such as the user's finger or a pen is brought into contact with a surface of the display device 10 disposed on the touch sensing layer. The user's proximity touch refers to that an object such as the user's finger or a pen is hovering over a surface of the display device 10. The touch driver 330 may output touch data including user's touch coordinates to the main processor 710.

The vibration driver 340 may be attached to the upper surface of the display circuit board 310. The vibration driver 340 receives vibration data or sound data from the main circuit board 700. The vibration driver 340 generates first and second driving voltages according to the vibration data or the sound data and outputs the first and second driving voltages to the first vibration device 510. The vibration driver 340 may be implemented as an IC.

The first and second driving voltages applied thereto may be a sine wave or a square wave. When the first and second driving voltages applied thereto are square waves, even when different haptic feedbacks are continuously implemented using the first vibration device 510, the user may receive the different haptic feedbacks clearly.

On the display circuit board 310, a power supply for supplying display driving voltages for driving the display driving circuit 320 may be disposed. When the display driving voltages and the first and second driving voltages are generated in a single circuit, they may be influenced by each other. For this reason, the display driving voltages for driving the display panel 300 and the first and second driving voltages for driving the first vibration device 510 may be generated in different circuits. Therefore, it is possible to prevent the display driving voltages and the first and second driving voltages from being influenced by with each other.

One side of the flexible film 390 may be attached on the upper surface of the lower part of the display panel 300 using an anisotropic conductive film. The other side of the flexible film 390 may be attached on the upper surface of the upper part of the display circuit board 310 using an anisotropic conductive film. The flexible film 390 may be a flexible film that may be bent.

In another exemplary embodiment, the flexible film 390 may be eliminated and the display circuit board 310 may be attached directly to one side of the display panel 300. In such case, one side of the display panel 300 may be bent downward such that it is disposed under the display panel 300.

Figure 5:
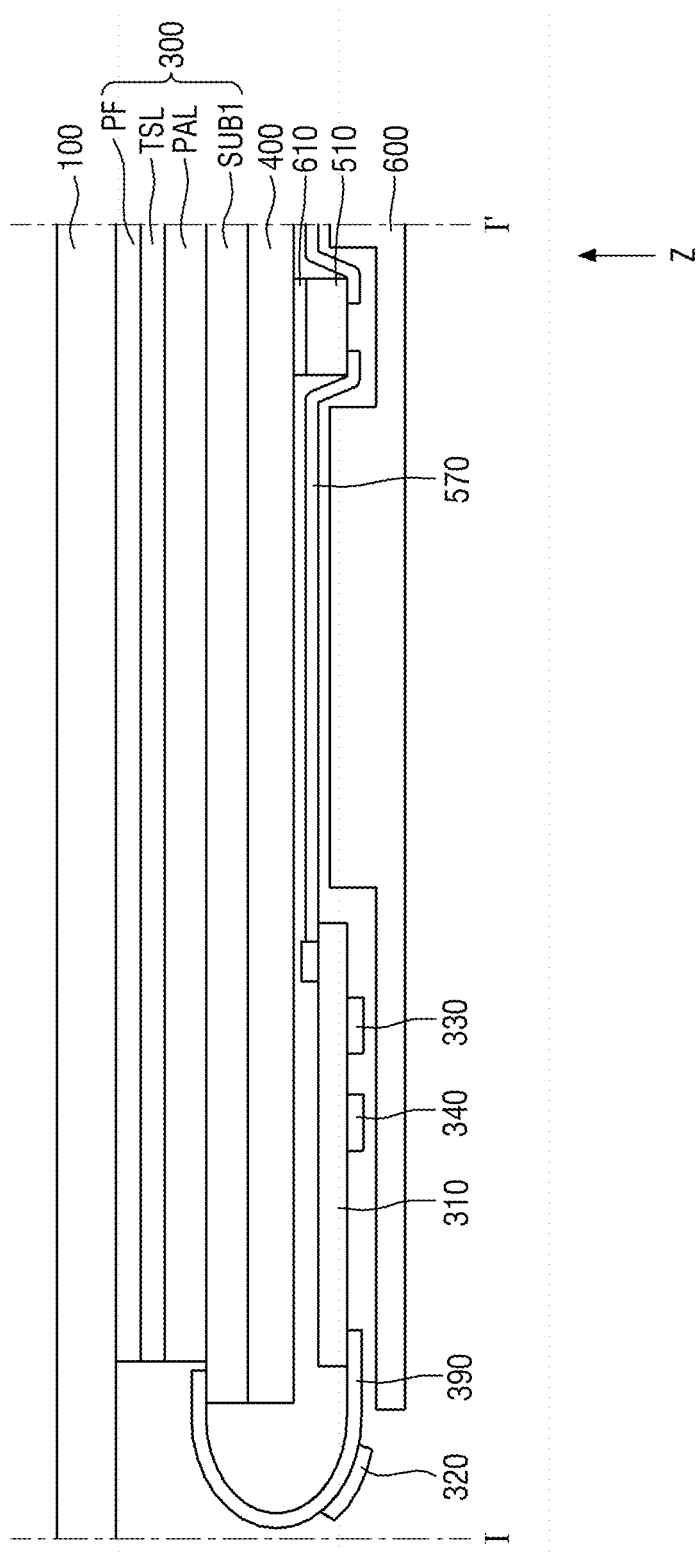
FIG. 5 is a cross-sectional view taken along line I-I' of FIG. 4.

The first vibration device 510 may be disposed on the surface of the display panel 300. The first vibration device 510 may be attached to the surface of the display panel 300 using an adhesive member 610 such as a pressure-sensitive adhesive, as shown in FIG. 5. When a cover panel member 400 is disposed on the surface of the display panel 300 as shown in FIG. 5, the first vibration device 510 may be attached to the cover panel member 400 through the adhesive member 610. The first vibration device 510 may be a piezoelectric element or a piezoelectric actuator including a piezoelectric material that contracts or expands according to a voltage applied thereto. Although the first vibration device 510 has a cuboid shape in FIG. 2, the invention is not limited thereto.

The bracket 600 may be disposed under the display panel 300. The bracket 600 may include plastic, metal, or both plastic and metal. In the bracket 600, a first camera hole CMH1 in which a camera device 720 is inserted, a battery hole BH in which a battery 790 is disposed, and a cable hole CAH through which a cable 314 connected to the display circuit board 310 passes are defined.

The main circuit board 700 and the battery 790 may be disposed under the bracket 600. The main circuit board 700 may be either a printed circuit board or an FPCB.

The main circuit board 700 may include a main processor 710, a camera device 720, a main connector 730 and a memory 740. The main processor 710 may be implemented as an IC.

The camera device 720 may be disposed on both the upper and lower surfaces of the main circuit board 700, the main processor 710 and the memory 740 are disposed on the upper surface of the main circuit board 700, and the main connector 730 may be disposed on the lower surface of the main circuit board 700.

The main processor 710 may control all the functions of the display device 10. In an exemplary embodiment, the main processor 710 may output digital video data to the display driving circuit 320 through the display circuit board 310 so that the display panel 300 displays images, for example. In addition, the main processor 710 may receive touch data including a user's touch coordinates from the touch driver 330 and may determine whether there is the user's touch or a proximity touch, and when there is the user's touch or a proximity touch, then may perform an operation associated with the user's touch input or the proximity touch. In an exemplary embodiment, the main processor 710 may perform an application or an operation indicated by the icon touched by the user, for example.

The main processor 710 may control the first vibration device 510 according to a haptic mode and a sound mode. The main processor 710 may output operation information to the memory 740 which is to be executed by a user's touch input or proximity input and may receive vibration data associated with the operation information from the memory 740 in the haptic mode. The main processor 710 may output the vibration data to the vibration driver 340 in the haptic mode.

The main processor 710 receives sound source data from an external device in the sound mode. The main processor 710 may generate sound data for generating first and second driving voltages to drive the vibration device 510 based on the sound source data in the sound mode. In an alternative exemplary embodiment, the main processor 710 may output the frequency information of the sound source data in the sound mode to the memory 740, and may receive the sound data corresponding to the frequency information of the sound source data from the memory 740. The main processor 710 may output sound data to the vibration driver 340 in the sound mode.

The main processor 710 may control the first vibration device 510 so that the sound mode and the haptic mode are executed simultaneously. In such case, the main processor 710 may output the sum of the sound data and the vibration data to the vibration driver 340.

In an exemplary embodiment, the main processor 710 may be an application processor, a central processing unit, or a system chip implemented as an IC.

The camera device 720 processes image frames such as still image and video obtained by the image sensor in the camera mode and outputs them to the main processor 710.

The cable 314 passing through the cable hole CAH of the bracket 60 may be connected to main connector 730. Accordingly, the main circuit board 700 may be electrically connected to the display circuit board 310.

The memory 740 may store therein vibration data according to operation information executed by the user's touch input or proximity input. The memory 740 may be a look-up table ("LUT") for outputting vibration data with the operation information as an input address. In addition, the memory 740 may store therein sound data according to frequency information of the sound source data. The memory 740 may be an LUT for outputting sound data with the frequency information as an input address.

The battery 790 may not overlap the main circuit board 700 in the third direction (Z-axis direction). The battery 790 may overlap with the battery hole BH of the bracket 600.

Besides, a mobile communications module capable of transmitting/receiving a radio signal to/from at least one of a base station, an external terminal and a server over a mobile communications network may be further disposed (e.g., mounted) on the main circuit board 700. In an exemplary embodiment, the wireless signal may include various types of data depending on a voice signal, a video call signal, or a text/multimedia message transmission/reception.

The bottom cover 900 may be disposed under the main circuit board 700 and the battery 790. The bottom cover 900 may be fastened and fixed to the bracket 600. The bottom cover 900 may form the exterior of the lower surface of the display device 10. In an exemplary embodiment, the bottom cover 900 may include plastic, metal or plastic and metal, for example.

A second camera hole CMH2 may be defined in the bottom cover 900 via which the lower surface of the camera device 720 is exposed. The positions of the camera device 720 and the first and second camera holes CMH1 and CMH2 in line with the camera device 720 are not limited to those of the exemplary embodiment shown in FIG. 2.

Figure 3A:
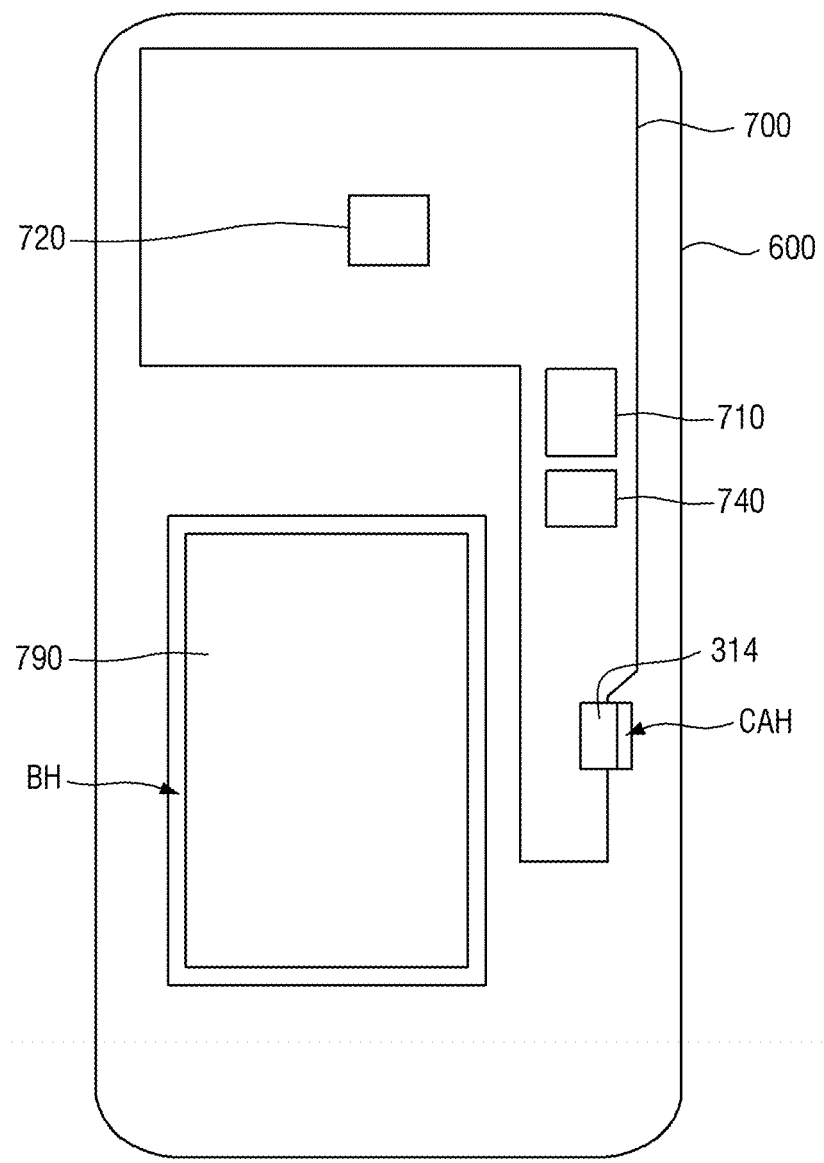
FIG. 3A is a bottom view showing an exemplary embodiment of the display panel attached to the cover window of FIG. 2.
Figure 3B:
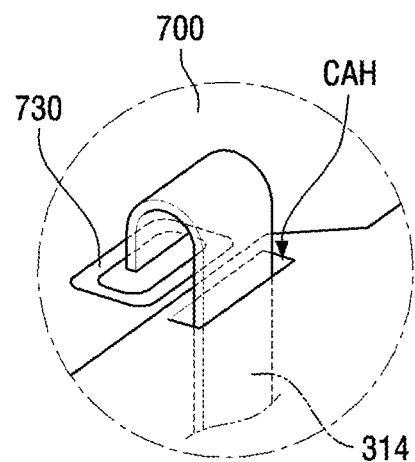
FIG. 3B is an enlarged view of a portion of the display panel of FIG. 3A.
Figure 4:
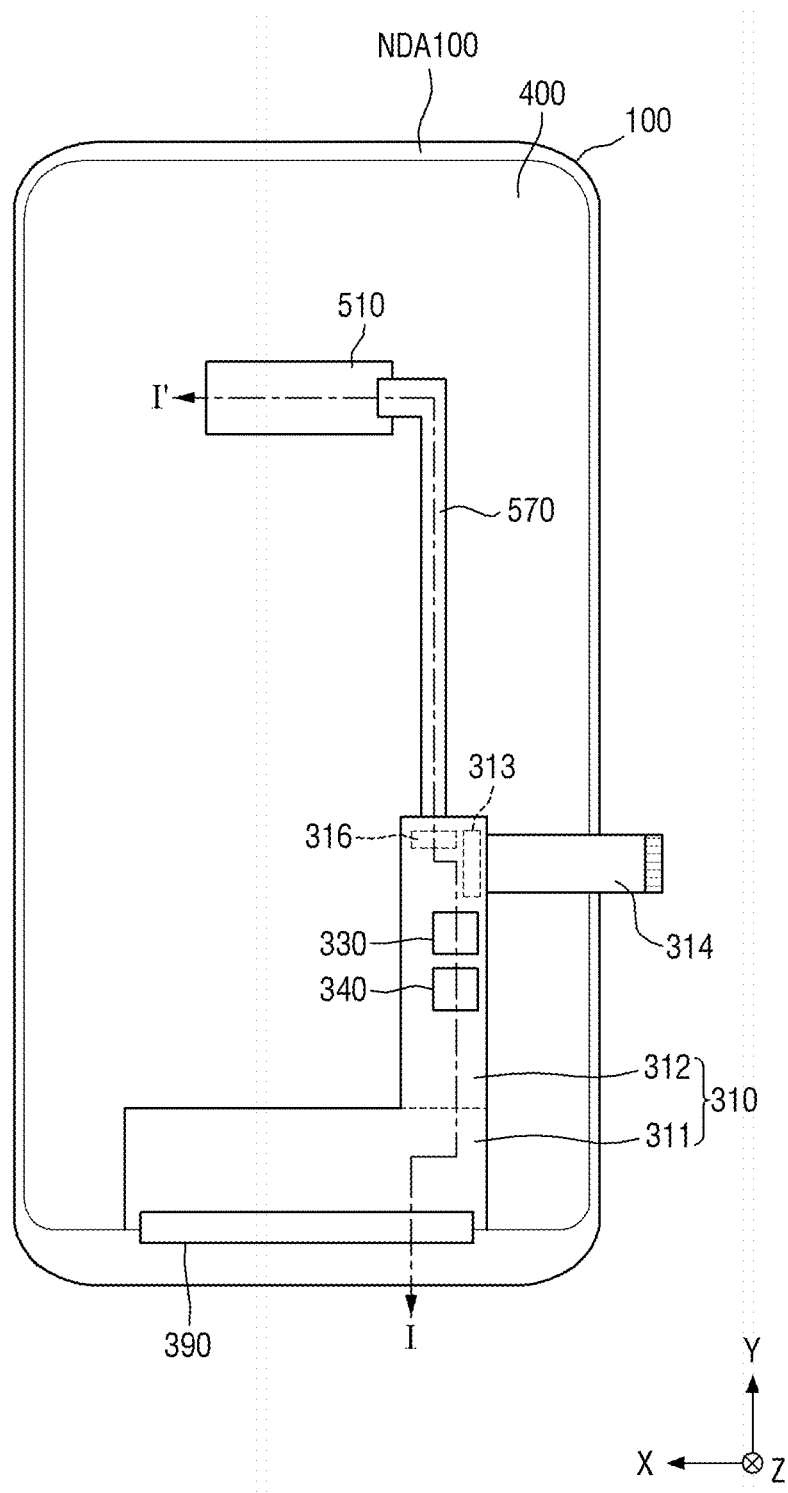
FIG. 4 is a bottom view showing an exemplary embodiment of the bracket attached under the display panel of FIG. 3A and the main circuit board disposed on the bracket.

FIG. 3A is a bottom view showing an exemplary embodiment of the display panel attached to the cover window of FIG. 2, and FIG. 3B is an enlarged view of a portion of the display panel of FIG. 3A. FIG. 4 is a bottom view showing an exemplary embodiment of the bracket attached under the display panel of FIG. 3 and the main circuit board disposed on the bracket. FIG. 5 is a cross-sectional view taken along line I-I' of FIG. 4.

Referring to FIGS. 3A to 5, the cover panel member 400 may be disposed under the display panel 300. The cover panel member 400 may be attached to the lower surface of the display panel 300 by an adhesive member. In an exemplary embodiment, the adhesive member may be a pressure-sensitive adhesive ("PSA"), for example.

The cover panel member 400 may include at least one of a light-absorbing member for absorbing light incident from outside, a buffer member for absorbing external impact, and a heat-dissipating member for efficiently discharging heat from the display panel 300.

The light-absorbing member may be disposed under the display panel 300. The light-absorbing member blocks the transmission of light to prevent the elements disposed thereunder from being seen from above the display panel 300, such as the display circuit board 310 and the vibration device 510. The light-absorbing member may include a light-absorbing material such as a black pigment and a dye.

The buffer member may be disposed under the light-absorbing member. The buffer member absorbs an external impact to prevent the display panel 300 from being damaged. The buffer member may include a single layer or multiple layers. In an exemplary embodiment, the buffer member may include a polymer resin such as polyurethane, poly carbonate, polypropylene and polyethylene, or may include a material having elasticity such as a rubber and a sponge obtained by foaming a urethane-based material or an acrylic-based material. The buffer member may be a cushion layer.

The heat-dissipating member may be disposed under the buffer member. The heat-dissipating member may include a first heat-dissipating layer including graphite or carbon nanotubes, and a second heat dissipation layer including a thin metal film such as copper, nickel, ferrite and silver, which may block electromagnetic waves and have high thermal conductivity.

In another exemplary embodiment, the cover panel member 400 may be eliminated. Then, the elements disposed on the lower surface of the cover panel member 400, e.g., the display circuit board 310 and the vibration device 510 may be disposed on the lower surface of the display panel 300 instead of the lower surface of the cover panel member 400.

The flexible film 390 attached to the side of the display panel 300 may be bent and disposed under the cover panel member 400 as shown in FIGS. 4 and 5. Therefore, the display circuit board 310 attached to the side of the flexible film 390 may be disposed under the cover panel member 400. The display circuit board 310 may be fixed or bonded to the lower surface of the cover panel member 400 by a fixing member such as a screw or an adhesive member such as a PSA under the cover panel member 400.

The display circuit board 310 may include a first circuit board 311 and a second circuit board 312. Each of the first display circuit board 310 and the second circuit board 312 may be a rigid printed circuit board or an FPCB. When one of the first circuit board 311 and the second circuit board is a rigid printed circuit board and the other is an FPCB, the display circuit board 310 may be a hybrid printed circuit board.

In example shown in FIG. 4, the second circuit board 312 is extended from one side of the first circuit board 311 in the second direction (Y-axis direction). The width of the second circuit board 312 in the first direction (X-axis direction) may be smaller than the width of the first circuit board 311 in the first direction (X-axis direction).

The touch driver 330 and the vibration driver 340 may be disposed on the surface of the second circuit board 312, while a first connector 313 and a second connector 316 may be disposed on the other surface of the second circuit board 312. The first connector 313 may include an insertion portion connected to a first connection terminal provided at one end of the cable 314. The second connector 316 may include an insertion portion connected to a connection terminal disposed at one end of the first flexible circuit board 570.

The first connection terminal provided at one end of the cable 314 may be inserted into the insertion portion of the first connector 313. The second connection terminal provided at the other end of the cable 314 may be bent below the main circuit board 700 through the cable hole CAH penetrating the bracket 600, to be inserted into the main connector 730 as shown in FIG. 4.

The first vibration device 510 may be disposed on the lower surface of the cover panel member 400. The first vibration device 510 may be attached to the lower surface of the cover panel member 400 by a first adhesive member 610 such as a pressure-sensitive adhesive. Accordingly, the display panel 300 may vibrate in the thickness direction (Z-axis direction) by the first vibration device 510.

The connection terminal provided at one end of the first flexible circuit board 570 may be inserted into the insertion portion of the second connector 316. The other end of the first flexible circuit board 570 may be connected to the first vibration device 510. In an exemplary embodiment, the first flexible circuit board 570 may be an FPCB or an FPC, for example.

The battery hole BH, the cable hole CAH and the first camera hole CMH1 may be defined in the bracket 600. The battery hole BH, the cable hole CAH and the first camera hole CMH1 may penetrate through the bracket 600.

Since the battery hole BH accommodates the battery, the battery 790 may overlap the battery hole BH in the third direction (Z-axis direction) as shown in FIG. 3A. The size of the battery hole BH may be larger than the size of the battery 790 as shown in FIG. 3A.

The first camera hole CMH1 of the bracket 600 is a hole for accommodating the camera device 720 of the main circuit board 700 so that the camera device 720 may overlap the first camera hole CMH1 in the third direction (Z-axis direction).

In the exemplary embodiments shown in FIGS. 3A, 3B and 4, the first vibration device 510 may be electrically connected to the display circuit board 310 through the first flexible circuit board 570. The main circuit board 700 and the display circuit board 310 may be electrically connected to each other through the cable 314.

Referring to FIG. 5, the display panel 300 may include a substrate SUB1, a pixel array layer PAL, and a polarizing film PF.

The substrate SUB1 may be a rigid substrate or a flexible substrate that may be bent, folded, rolled, and so on. The substrate SUB1 may include an insulating material such as glass, quartz and a polymer resin. The examples of the polymer material may be polyethersulphone ("PES"), polyacrylate ("PA"), polyacrylate ("PAR"), polyetherimide ("PEI"), polyethylenenapthalate ("PEN"), polyethyleneterepthalate ("PET"), polyphenylenesulfide ("PPS"), polyallylate, polyimide ("PI"), polycarbonate ("PC"), cellulosetriacetate ("CAT"), cellulose acetate propionate ("CAP"), or combinations thereof. The substrate SUB1 may include a metal material.

Figure 6:
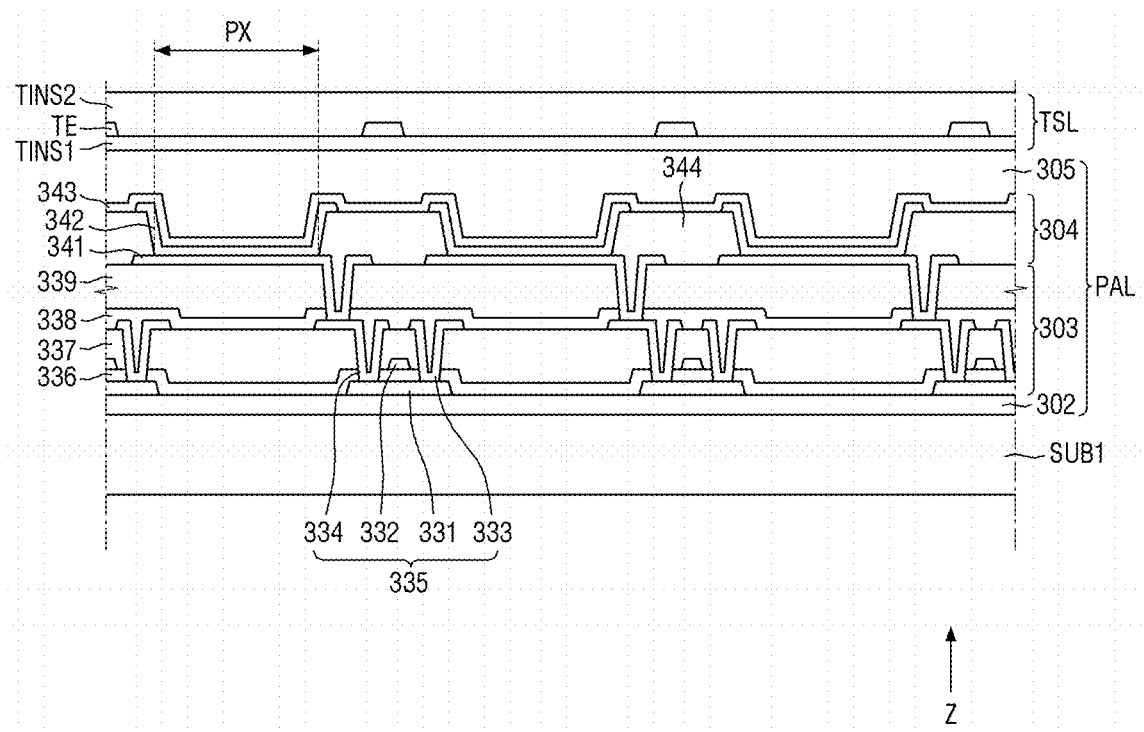
FIG. 6 is a cross-sectional view showing the display area of the display panel of FIG. 5 in detail.

The pixel array layer PAL may be disposed on the substrate SUB1. The pixel array layer PAL may include pixels PX to display an image. The pixel array layer PAL may include a thin-film transistor ("TFT") layer 303, a light-emitting element layer 304 and a thin-film encapsulation layer 305 as shown in FIG. 6.

The touch sensing layer TSL may be disposed on the pixel array layer PAL. The touch sensing layer TSL may include sensor electrodes TE to detect at least one user's touch input.

The polarizing film PF may be disposed on the touch sensing layer TSL in order to prevent a decrease in visibility due to reflection of external light. In an exemplary embodiment, the polarizing film PF may include a linear polarizer and a retardation film such as a λ/4 (quarter-wave) plate, for example. In an exemplary embodiment, the retardation film may be disposed on the touch sensing layer TSL, and the linear polarizer may be disposed between the retardation film and the cover window 100, for example.

The cover panel member 400 may be disposed on a first surface of the display panel 300, and the cover window 100 may be disposed on a second surface of the display panel 300 opposite to the first surface. That is to say, the cover panel member 400 may be disposed on the lower surface of the substrate SUB1 of the display panel 300, and the cover window 100 may be disposed on the upper surface of the polarizing film PF.

One side of the flexible film 390 may be attached to one side of the substrate SUB1, while the other side of the flexible film 390 may be attached to one side of the display circuit board 310. One side of the flexible film 390 may be attached to one side of the substrate SUB1 using an anisotropic conductive film. The other side of the flexible film 390 may be attached to one surface of the display circuit board 310 using an anisotropic conductive film. The opposite surface of the display circuit board 310 may face the cover panel member 400.

Although the display driving circuit 320 is disposed on the surface of the flexible film 390 in FIG. 5, the invention is not limited thereto. The display driving circuit 320 may be disposed on the opposite surface of the flexible film 390. The other surface of the flexible film 390 may be attached to one surface of the substrate SUB1 and one surface of the display circuit board 310.

The display circuit board 310 may be disposed on the lower surface of the cover panel member 400. The display circuit board 310 may be fixed to the lower surface of the cover panel member 400 by a fixing member such as a screw or an adhesive member.

The touch driver 330 and the vibration driver 340 may be disposed on one side of the display circuit board 310. The first connector 313 and the second connector 316 may be disposed on the other surface of the display circuit board 310.

The first vibration device 510 may be disposed between the panel lower member 400 and the bracket 600. A first surface of the first vibration device 510 may be attached to the cover panel member 400 by a first adhesive member 610. Since the first vibration device 510 may be fixed to the cover panel member 400, the display panel 300 may be vibrated by the vibration of the first vibration device 510. That is to say, the first vibration device 510 may vibrate the display panel 300 to output a first sound. The first adhesive member 610 may be a pressure-sensitive adhesive. The first flexible circuit board 570 may be attached to the second surface of the first vibration device 510.

If the first vibration device 510 is disposed on the heat-dissipating member of the cover panel member 400, the first heat-dissipating layer of the heat-dissipating member may be broken by the vibration of the first vibration device 510. Therefore, a part of the heat-dissipating member may be eliminated so that it does not overlap with the first vibration device 510, and the first vibration device 510 may be attached to the lower surface of the buffer member. In an alternative exemplary embodiment, a part of the buffer member and the heat-dissipating member may be eliminated so that they do not overlap with the first vibration device 510, and the first vibration device 510 may be attached to the lower surface of the light-absorbing member.

The first flexible circuit board 570 may be attached to the second surface of the first vibration device 510 using an anisotropic conductive film. The lead lines of the first flexible circuit board 570 may be connected to the first electrode and the second electrode of the first vibration device 510, respectively. A connection terminal provided at one end of the first flexible circuit board 570 may be connected to the lead lines. The connection terminal of the first flexible circuit board 570 may be inserted into the insertion portion of the second connector 316. The first flexible circuit board 570 may be an FPC or a flexible film.

FIG. 6 is a cross-sectional view showing the display area of the display panel of FIG. 5 in detail.

Referring to FIG. 6, the display panel 300 may include the substrate SUB1 and the pixel array layer PAL. The pixel array layer PAL may include a TFT layer 303, a light-emitting element layer 304 and a thin-film encapsulation layer 305 as shown in FIG. 6.

A buffer layer 302 may be disposed on the substrate SUB1. The buffer layer 302 may be disposed on the substrate SUB1 to protect the TFTs 335 and the light-emitting elements from moisture permeating through the substrate SUB1 that is susceptible to moisture permeation. The buffer layer 302 may include a plurality of inorganic layers stacked on one another alternately. In an exemplary embodiment, the buffer layer 302 may include multiple layers in which one or more inorganic layer of a silicon oxide layer (SiOx), a silicon nitride layer (SiNx) and SiON are stacked on one another alternately, for example. In another exemplary embodiment, the buffer layer may be eliminated.

The TFT layer 303 is disposed on the buffer layer 302. The TFT layer 303 includes TFTs 335, a gate insulating layer 336, an interlayer dielectric layer 337, a protective layer 338, and a planarization layer 339.

Each of the TFTs 335 includes an active layer 331, a gate electrode 332, a source electrode 333 and a drain electrode 334. In FIG. 6, the TFTs 335 are implemented as top-gate transistors in which the gate electrode 332 is disposed above the active layer 331. It is, however, to be understood that the invention is not limited thereto. That is to say, the TFTs 335 may be implemented as bottom-gate transistors in which the gate electrode 332 is disposed below the active layer 331, or as double-gate transistors in which the gate electrodes 332 are disposed above and below the active layer 331.

The active layer 331 is disposed on the buffer layer 302. The active layer 331 may include a silicon-based semiconductor material or an oxide semiconductor material. In an exemplary embodiment, the active layer 331 may include polycrystalline silicon, amorphous silicon, or an oxide semiconductor, for example. A light-blocking layer for blocking external light incident on the active layer 331 may be disposed between the buffer layer 302 and the active layer 331.

The gate insulating layer 336 may be disposed on the active layer 331. In an exemplary embodiment, the gate insulating layer 336 may include an inorganic layer, for example, a silicon oxide layer (SiOx), a silicon nitride layer (SiNx), or a multilayer thereof.

The gate electrode 332 and a gate line may be disposed on the gate insulating layer 336. In an exemplary embodiment, the gate electrode 332 and the gate line may include a single layer or multiple layers of one of molybdenum (Mo), aluminum (Al), chromium (Cr), gold (Au), titanium (Ti), nickel (Ni), neodymium (Nd) and copper (Cu) or an alloy thereof.

The interlayer dielectric layer 337 may be disposed over the gate electrode 332 and the gate line. In an exemplary embodiment, the interlayer dielectric layer 337 may include an inorganic layer, for example, a silicon oxide layer (SiOx), a silicon nitride layer (SiNx), or a multilayer thereof.

The source electrode 333, the drain electrode 334 and a data line may be disposed on the interlayer dielectric layer 337. Each of the source electrode 333 and the drain electrode 334 may be connected to the active layer 331 through a contact hole penetrating the gate insulating layer 336 and the interlayer dielectric layer 337. In an exemplary embodiment, the source electrode 333, the drain electrode 334 and the data line may include a single layer or multiple layers of one of molybdenum (Mo), aluminum (Al), chromium (Cr), gold (Au), titanium (Ti), nickel (Ni), neodymium (Nd) and copper (Cu) or an alloy thereof.

The protective layer 338 may be disposed on the source electrode 333, the drain electrode 334, and the data line in order to insulate the TFTs 335. In an exemplary embodiment, the protective layer 338 may include an inorganic layer, e.g., a silicon oxide layer (SiOx), a silicon nitride layer (SiNx), or a multilayer thereof.

The planarization layer 339 may be disposed on the protective layer 338 to provide a flat surface over the step differences of the TFTs 335. The planarization layer 339 may include an organic layer such as an acryl resin, an epoxy resin, a phenolic resin, a polyimide resin and a polyimide resin.

The light-emitting element layer 304 is disposed above the TFTs 335. The light-emitting element layer 304 includes the light-emitting elements and banks 344.

The light-emitting elements and the banks 344 are disposed on the planarization layer 339. An organic light-emitting device including an anode electrode 341, emissive layers 342 and a cathode electrode 343 is employed as an exemplary embodiment of the light-emitting elements.

The anode electrode 341 may be disposed on the planarization layer 339. The anode electrode 341 may be connected to the source electrode 333 of the respective thin-film transistor 335 through a contact hole penetrating the protective layer 338 and the planarization layer 339.

The banks 344 may cover the edge of the anode electrode 341 on the planarization layer 339 in order to separate the pixels from one another. That is to say, the banks 344 serves as a layer for defining the pixels PX. In each of the pixels PX, the anode electrode 341, the emissive layer 342 and the cathode electrode 343 are sequentially stacked on one another so that holes from the anode electrode 341 and electrons from the cathode electrode 343 combine in the emissive layer 342 to emit light.

The emissive layers 342 are disposed on the anode electrode 341 and the banks 344. The emissive layers 342 may be organic emissive layers. In an exemplary embodiment, the emissive layer 342 may emit one of red light, green light, and blue light, for example. In an alternative exemplary embodiment, the emissive layer 342 may be a white emissive layer that emits white light. In such case, the red emissive layer, the green emissive layer and the blue emissive layer may be stacked on one another or may be provided commonly across the pixels PX as a common layer. In such case, the display panel 300 may further include additional color filters for representing red, green and blue colors.

The emissive layer 342 may include a hole transporting layer, a light-emitting layer, and an electron transporting layer. In addition, the emissive layer 342 may be provided in a tandem structure of two or more stacks, in which case a charge generating layer may be disposed between the stacks.

The cathode electrode 343 is disposed on the emissive layer 342. The cathode electrode 343 may be provided to cover the emissive layer 342. The cathode electrode 343 may be a common layer provided across the pixels PX.

In an exemplary embodiment, when the light-emitting element layer 304 is of a top-emission type in which light exits toward the upper side, the anode electrode 341 may include a metal material having a high reflectivity such as a stack structure of aluminum and titanium (Ti/Al/Ti), a stack structure of aluminum and ITO ("ITO/Al/ITO"), an APC alloy and a stack structure of APC alloy and ITO ("ITO/APC/ITO"). The APC alloy is an alloy of silver (Ag), palladium (Pd) and copper (Cu). The cathode electrode 343 may include a transparent conductive material ("TCP") such as ITO and IZO that may transmit light, or a semi-transmissive conductive material such as magnesium (Mg), silver (Ag) and an alloy of magnesium (Mg) and silver (Ag). When the cathode electrode 343 includes a semi-transmissive conductive material, the light extraction efficiency may be increased by microcavities.

In an exemplary embodiment, when the light-emitting element layer 304 is of a bottom-emission type in which light exits toward the lower side, the anode electrode 341 may include a TCP such as ITO and IZO that may transmit light, or a semi-transmissive conductive material such as magnesium (Mg), silver (Ag) and an alloy of magnesium (Mg) and silver (Ag). The cathode electrode 343 may include a metal material having a high reflectivity such as a stack structure of aluminum and titanium (Ti/Al/Ti), a stack structure of ITO/Al/ITO, an APC alloy and a stack structure of ITO/APC/ITO. When the anode electrode 341 includes a semi-transmissive conductive material, the light extraction efficiency may be increased by microcavities.

The thin-film encapsulation layer 305 is disposed on the light-emitting element layer 304. The thin-film encapsulation layer 305 serves to prevent permeation of oxygen or moisture into the emissive layer 342 and the cathode electrode 343. To this end, the thin-film encapsulation layer 305 may include at least one inorganic layer. In an exemplary embodiment, the inorganic layer may include silicon nitride, aluminum nitride, zirconium nitride, titanium nitride, hafnium nitride, tantalum nitride, silicon oxide, aluminum oxide, or titanium oxide, for example. Further, the thin-film encapsulation layer 305 may further include at least one organic layer. The organic layer may have a sufficient thickness to prevent particles from permeating into the thin-film encapsulation layer 305 to enter the emissive layer 342 and the cathode electrode 343. In an exemplary embodiment, the organic layer may include at least one of epoxy, acrylate, urethane acrylate, polyamide, and polyimide resin.

The touch sensing layer TSL may be disposed on the thin-film encapsulation layer 305. When the touch sensing layer TSL is disposed directly on the thin-film encapsulation layer 305, the thickness of the display device 10 may be reduced, compared with a display device in which a separate touch panel is attached on the thin-film encapsulation layer 305.

The touch sensing layer TSL may include sensor electrodes TE for sensing a user's touch by capacitive sensing, and touch lines for connecting the pads with the sensor electrodes TE. In an exemplary embodiment, the touch sensing layer TSL may sense a user's touch by self-capacitance sensing method or mutual capacitance sensing method. In FIG. 6, it is exampled that the touch sensing layer TSL senses a user's touch by mutual capacitance sensing method.

A first sensing insulator TINS1 may be disposed on the thin-film encapsulation layer 305. In an exemplary embodiment, the first sensing insulator TINS1 may include an inorganic layer, for example, a silicon oxide layer (SiOx), a silicon nitride layer (SiNx), or a multilayer thereof. In an alternative exemplary embodiment, the first sensing insulator TINS1 may include an organic layer, for example, epoxy, acrylate, urethane acrylate, polyamide, and polyimide resin. Connection electrodes may be disposed between the thin-film encapsulation layer 305 and the first sensing insulator TINS1.

The sensor electrodes TE may be disposed on the first sensing insulator TINS1. The sensor electrodes TE may include a stack structure of aluminum and titanium (Ti/Al/Ti), a stack structure of ITO/Al/ITO, an APC alloy and a stack structure of ITO/APC/ITO.

A second sensing insulator TINS2 may be disposed on the sensor electrodes TE. In an exemplary embodiment, the second sensing insulator TINS2 may include an organic layer, for example, epoxy, acrylate, urethane acrylate, polyamide, and polyimide resin.

Figure 7:
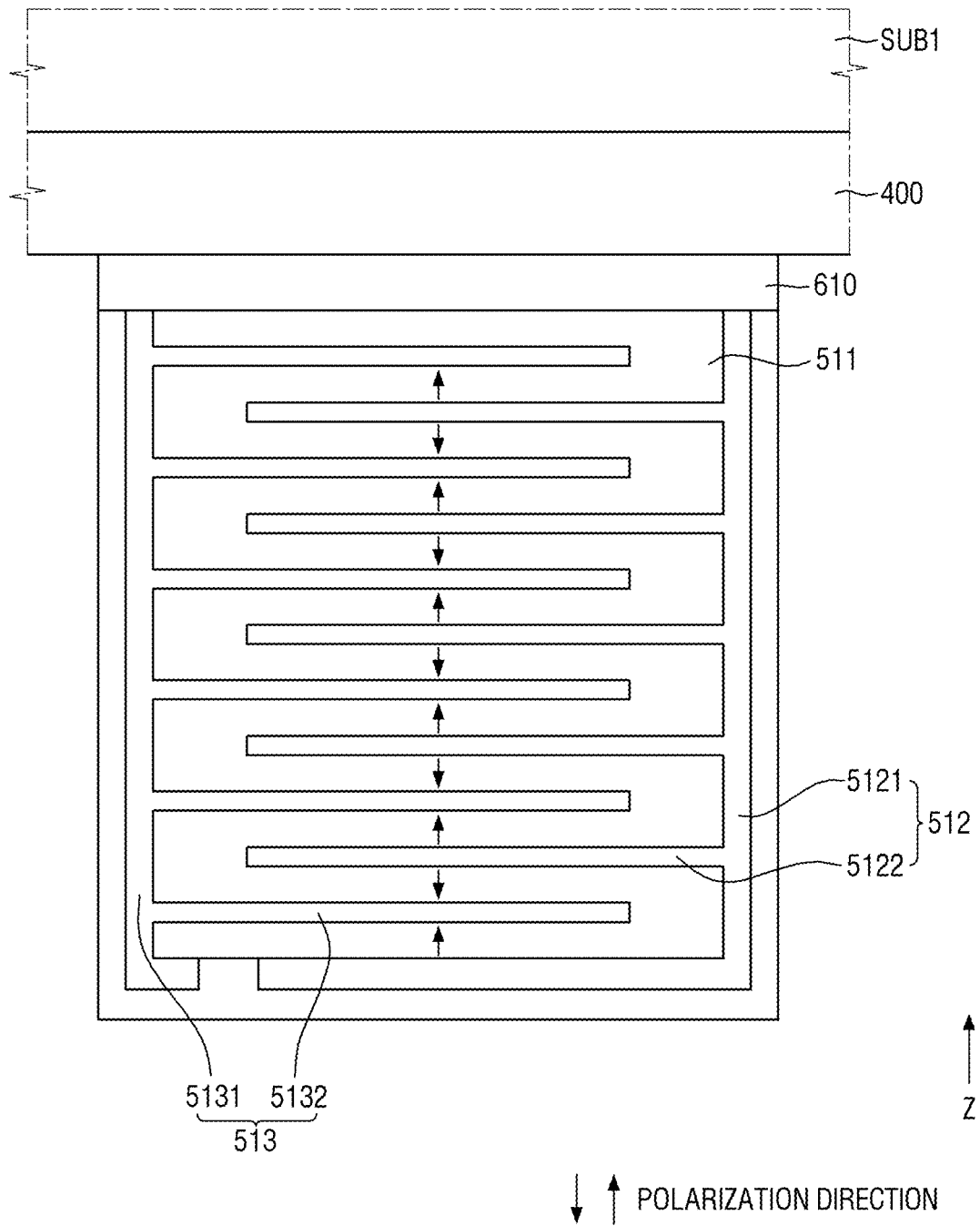
FIG. 7 is a cross-sectional view showing the first vibration device of FIG. 5 in detail.
Figure 8:
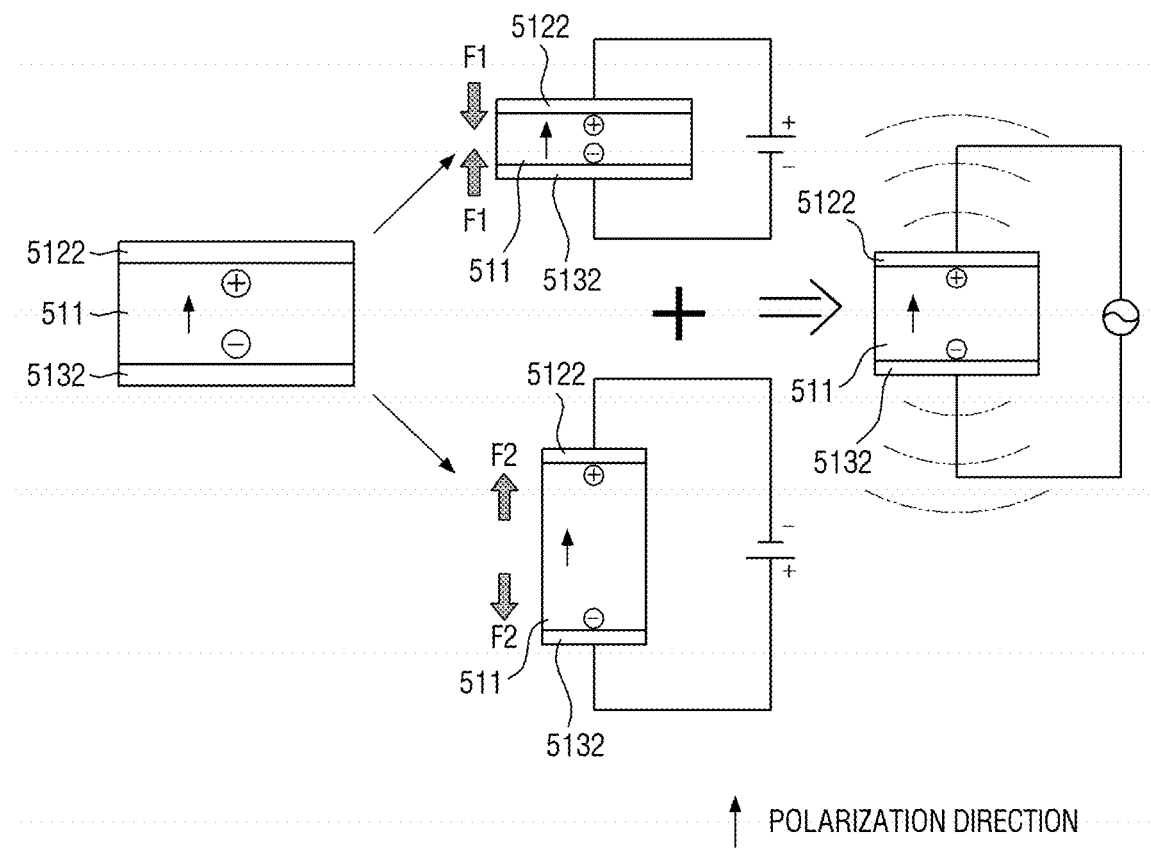
FIG. 8 is a view showing an exemplary embodiment of a way of vibrating a vibration layer disposed between a first branch electrode and a second branch electrode of the first vibration device of FIG. 7.

FIG. 7 is a cross-sectional view showing the first vibration device of FIG. 5 in detail. FIG. 8 is a view showing an exemplary embodiment of a way of vibrating a vibration layer disposed between a first branch electrode and a second branch electrode of the second vibration device of FIG. 7.

Referring to FIGS. 7 and 8, the first vibration device 510 may be a piezoelectric element or a piezoelectric actuator which vibrates the display panel 300 using a piezoelectric material that contracts or expands according to the applied voltage. The first vibration device 510 may include a vibration layer 511, a first electrode 512, and a second electrode 513.

The first electrode 512 may include a first stem electrode 5121 and first branch electrodes 5122. The first stem electrode 5121 may be disposed at least on one side surface of the vibration layer 511 as shown in FIG. 7. In an alternative exemplary embodiment, the first stem electrode 5121 may penetrate a part of the vibration layer 511. The first stem electrode 5121 may be disposed on the upper surface of the vibration layer 511. The first branch electrodes 5122 may branch off from the first stem electrode 5121. The first branch electrodes 5122 may be arranged in parallel.

A second electrode 513 may include a second stem electrode 5131 and second branch electrodes 5132. The second electrode 513 may be disposed spaced apart from the first electrode 512. As a result, the second electrode 513 may be electrically insulated from the first electrode 512. The second stem electrode 5131 may be disposed at least on a side surface of the vibration layer 511. In such instance, the first stem electrode 5121 may be disposed on a first side of the vibration layer 511 while the second stem electrode 5131 may be disposed on a second side of the vibration layer 511. In an alternative exemplary embodiment, the second stem electrode 5131 may penetrate a part of the vibration layer 511. The second stem electrode 5131 may be disposed on the upper surface of the vibration layer 511. The second branch electrodes 5132 may branch off from the second stem electrode 5131. The second branch electrodes 5132 may be arranged in parallel.

The first branch electrodes 5122 and the second branch electrodes 5132 may be arranged in parallel to one another in the horizontal direction (X-axis direction or Y-axis direction). In addition, the first branch electrodes 5122 and the second branch electrodes 5132 may be alternately arranged in the vertical direction (Z-axis direction). Specifically, in the vertical direction (Z-axis direction), the first branch electrode 5122 may be disposed, then the second branch electrode 5132 may be disposed, then the first branch electrode 5122 may be disposed, and so on.

The first electrode 512 and the second electrode 513 may be connected to the pads of the first flexible circuit board 570. The pads of the first flexible circuit board 570 may be connected to the first electrode 512 and the second electrode 513 exposed on one side of the first vibration device 510.

The vibration layer 511 may be a piezoelectric element that is deformed according to a driving voltage applied to the first electrode 512 and a driving voltage applied to the second electrode 513. In such case, the vibration layer 511 may be one of a piezoelectric material such as a poly vinylidene fluoride ("PVDF") film and a plumbum zirconate titanate ("PZT") and an electroactive polymer.

Since the vibration layer 511 is produced at a high temperature, the first electrode 512 and the second electrode 513 may include silver (Ag) having a high melting point or an alloy of silver (Ag) and palladium (Pd). In order to increase the melting point of the first electrode 512 and the second electrode 513, when the first electrode 512 and the second electrode 513 include an alloy of silver (Ag) and palladium (Pd), the content of silver (Ag) may be higher than the content of palladium (Pd).

The vibration layer 511 may be disposed in every space between the first branch electrodes 5122 and the second branch electrodes 5132. The vibration layer 511 contracts or expands according to a difference between the driving voltage applied to the first branch electrodes 5122 and the driving voltage applied to the second branch electrodes 5132.

When the polarity direction of the vibration layer 511 disposed between the first branch electrode 5122 and the second branch electrode 5132 disposed under the first branch electrode 5122 is upward direction (↑) as shown in FIG. 7, the vibration layer 511 may have a positive polarity in its upper portion adjacent to the first branch electrodes 5122 and a negative polarity in its lower portion adjacent to the second branch electrodes 5132. In addition, when the polarity direction of the vibration layer 511 disposed between the second branch electrode 5132 and the first branch electrode 5122 disposed under the second branch electrode 5132 is downward direction (↓) the vibration layer 511 may have a negative polarity in its upper portion adjacent to the second branch electrode 5132 and a positive polarity in its lower portion adjacent to the first branch electrode 5122. The polarity direction of the vibration layer 511 may be determined by a poling process of applying an electric field to the vibration layer 511 using the first branch electrodes 5122 and the second branch electrodes 5132.

As shown in FIG. 8, when the polarity direction of the vibration layer 511 disposed between the first branch electrode 5122 and the second branch electrode 5132 disposed under the first branch electrode 5122 is the upward direction (↑) when the driving voltage having the positive polarity is applied to the first branch electrode 5122 and the driving voltage having the negative polarity is applied to the second branch electrode 5132, the vibration layer 511 may contract according to a first force F1. The first force F1 may be a contractive force. In addition, when the driving voltage having the negative polarity is applied to the first branch electrode 5122 and the driving voltage having the positive polarity is applied to the second branch electrode 5132, the vibration layer 511 may expand according to a second force F2. The second force F2 may be an expanding force.

Similarly to FIG. 8, when the polarity direction of the vibration layer 511 disposed between the second branch electrode 5132 and the first branch electrode 5122 disposed under the second branch electrode 5132 is the downward direction (↓) when the 2A driving voltage having the positive polarity is applied to the second branch electrode 5132 and the 2B driving voltage having the negative polarity is applied to the first branch electrode 5122, the vibration layer 511 may expand according to the expanding force. In addition, when the driving voltage having the negative polarity is applied to the second branch electrode 5132 and the driving voltage having the positive polarity is applied to the first branch electrode 5122, the vibration layer 511 may contract according to a contract force.

When the driving voltage applied to the first electrode 512 and the driving voltage applied to the second electrode 513 have alternately repeated positive and negative polarities, the vibration layer 511 repeatedly contracts and expands. As a result, the first vibration device 510 vibrates. Since the first vibration device 510 is disposed on a surface of the heat-dissipation film, when the vibration layer 511 of the first vibration device 510 contracts and expands, the display panel 300 vibrates by the stress in the third direction (Z-axis direction), i.e., in the thickness direction. As such, the display panel 300 vibrates by the first vibration device 510, so that the first sound may be output.

A protective layer may be further disposed on the second surface and side surfaces of the first vibration device 510. The protective layer may include an insulating material, or may include the same material as that of the vibration layer 511. The protective layer may be disposed on the first electrode 512, the second electrode 513, and the vibration layer 511 exposed without being covered by the first electrode 512 and the second electrode 513. The protective layer may be disposed on the first electrode 512, the second electrode 513, and the vibration layer 511 exposed without being covered by the first electrode 512 and the second electrode 513. Therefore, the vibration layer 511, the first electrode 512 and the second electrode 513 of the first vibration device 510 may be protected by the protective layer. In another exemplary embodiment, the protective layer may be eliminated.

According to the exemplary embodiment shown in FIGS. 7 and 8, when the first vibration device 510 is a piezoelectric element or a piezoelectric actuator including a piezoelectric material, it includes no voice coil. Accordingly, compared with a linear resonant actuator ("LRA") that vibrates using a voice coil, there is an advantage that almost no vibration remains after the application of the first and second driving voltages is finished. Therefore, it is possible to improve the quality of a tactile feedback for a user in the haptic feedback.

Figure 10:
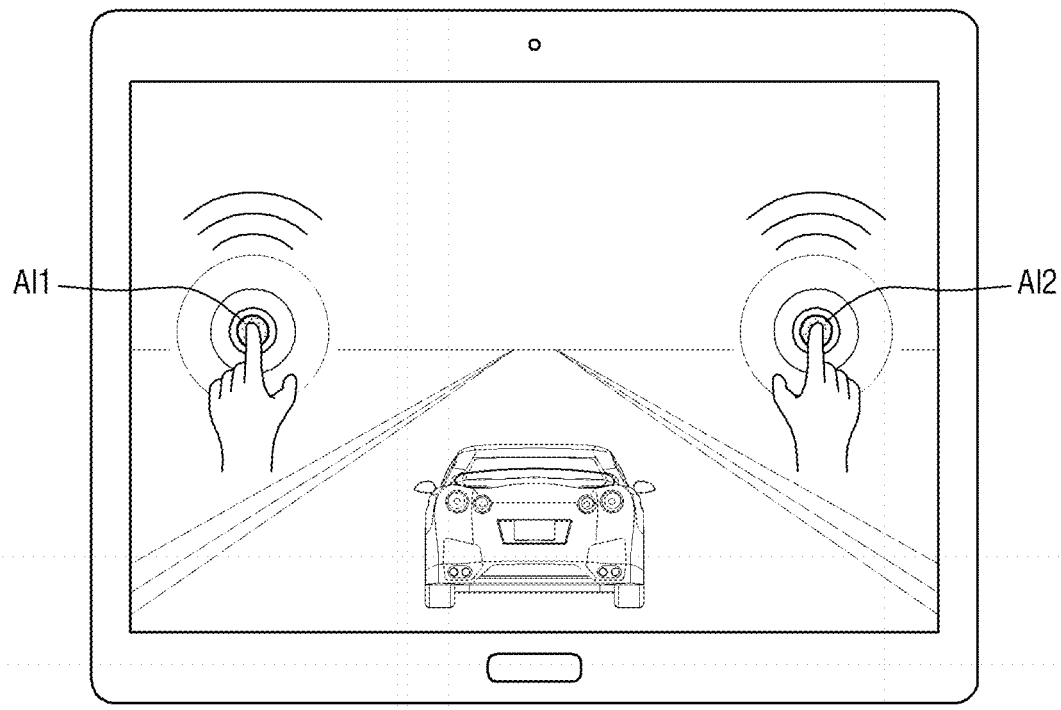
FIG. 10 is a view showing an exemplary embodiment of a screen of a display device where an application for providing the haptic feedback of FIG. 9 is running.

FIG. 9 is a table showing an exemplary embodiment of a method for providing a haptic feedback by a display device according to the invention. FIG. 9 shows game situations and a method for providing a haptic feedback according to a user's touch input when an application for a car racing game is running on a display device. FIG. 10 is a view showing an exemplary embodiment of a screen of a display device where an application for providing the haptic feedback of FIG. 9 is running.

Referring to FIGS. 9 and 10, the display device 10 may provide a user with different haptic feedbacks depending on the progress of the application and the user's touch input on the application, thereby increasing the user's immersion into the application. When a countdown starts in an application for a car racing game, the display device 10 may vibrate the first vibration device 510 with the maximum amplitude of 52 and the frequency of about 46 Hertz (Hz) for about 298 milliseconds (ms). In doing so, the first vibration device 510 may vibrate with the amplitude increasing four times and decreasing four times over the period of about 298 ms. The amplitude of the first vibration device 510 may increase four times to the same level at the equal interval and may decrease four times to the same level at the equal interval. Although the number of times of increasing and decreasing the amplitude is four in FIG. 9, the invention is not limited thereto. The number of times of increasing the amplitude may be N, and the number of times of decreasing the amplitude may be M, where N and M are positive integers.

When a vehicle starts to travel in the application, the display device 10 may vibrate the first vibration device 510 with the maximum amplitude of 66 and the frequency of about 62 Hz for about 736 ms.

When a user touches a first acceleration icon AI1 in the application, the display device 10 may vibrate the first vibration device 510 with the maximum amplitude of 60 and the frequency of about 203 Hz for about 98 ms. In doing so, the first vibration device 510 may vibrate with the amplitude increasing three times over the period of about 98 ms. In doing so, the amplitude of the first vibration device 510 may increase three times to the same level at the equal interval. Although the number of times of increasing the amplitude is three in FIG. 9, the invention is not limited thereto. The number of times of increasing the amplitude may be N.

When a user touches a second acceleration icon AI2 in the application, the display device 10 may vibrate the first vibration device 510 with the maximum amplitude of 60 and the frequency of 203 Hz for about 201 ms. When the user touches the second acceleration icon AI2, the vibration period of the first vibration device 510 may be longer than when the first acceleration icon AI1 is touched. In the example shown in FIG. 9, the frequency and the maximum amplitude of the first vibration device 510 when the user touches the first acceleration icon AI1 are equal to those of the first vibration device 510 when the user touches the second acceleration icon AI2. It is, however, to be understood that the invention is not limited thereto. The frequency and the maximum amplitude of the first vibration device 510 when the user touches the first acceleration icon AI1 may be different from those of the first vibration device 510 when the user touches the second acceleration icon AI2. In such case, the first vibration device 510 may vibrate with the amplitude increasing five times over the period of about 201 ms. In doing so, the amplitude of the first vibration device 510 may increase five times to the same level at the equal interval.

When a vehicle collides with another vehicle or an object in the application, the display device 10 may vibrate the first vibration device 510 with the maximum amplitude of 50 and the frequency of 148 Hz for about 47 ms. In doing so, the first vibration device 510 may vibrate with the amplitude increasing once and decreasing once over the period of about 47 ms. The amplitude of the first vibration device 510 may increase once to the same level at the equal interval and may decrease once to the same level at the equal interval. Although the number of times of increasing and decreasing the amplitude is one in FIG. 9, the invention is not limited thereto. The number of times of increasing the amplitude may be N while the number of times of decreasing the amplitude may be M.

When a vehicle drifts in the application, the display device 10 may vibrate the first vibration device 510 with the maximum amplitude of 52 and the frequency of 46 Hz for about 725 ms. In doing so, the first vibration device 510 may vibrate with the amplitude increasing once and decreasing once over the period of about 725 ms. The amplitude of the first vibration device 510 may increase once to the same level at the equal interval and may decrease once to the same level at the equal interval. Although the number of times of increasing and decreasing the amplitude is one in FIG. 9, the invention is not limited thereto. The number of times of increasing the amplitude may be N while the number of times of decreasing the amplitude may be M.

When a vehicle stops traveling in the application, the display device 10 may vibrate the first vibration device 510 with the maximum amplitude of 59 and the frequency of about 15 Hz for about 2,500 ms.

According to the exemplary embodiment shown in FIGS. 9 and 10, when the user performs a first touch input, i.e., the user touches the first acceleration icon AI1, the display device 10 may generate a first vibration using the first vibration device 510 to provide a first haptic feedback. In addition, when the user performs a second touch input, i.e., the user touches the second acceleration icon AI2, the display device 10 may generate a second vibration using the first vibration device 510 to provide a second haptic feedback. In an exemplary embodiment, the period of the second vibration may be longer than the period of the first vibration as shown in FIG. 9, for example. In such case, the user may feel that the vibration lasts longer when the user performs the second touch input, i.e., the user touches the second acceleration icon AI2 than when the user performs the first touch input, i.e., the user touches the first acceleration icon AI1. In addition, in the application, the user may feel that the effect of the acceleration executed by touching the second acceleration icon AI2 is higher than the effect of the acceleration executed by touching the first acceleration icon AI1.

In example shown in FIG. 9, the period of the first vibration is different from the period of the second vibration, and the amplitude of the frequency of the first vibration is equal to the amplitude of the second vibration. It is, however, to be understood that the invention is not limited thereto. In an exemplary embodiment, the frequency, amplitude and period of the first vibration may be different from the frequency, amplitude and period of the second vibration, respectively, for example. In an alternative exemplary embodiment, the frequency and amplitude of the first vibration may be different from the frequency and amplitude of the second vibration, respectively. In an alternative exemplary embodiment, the frequency and the period of the first vibration may be different from the frequency and period of the second vibration, respectively. In an alternative exemplary embodiment, the amplitude and the period of the first vibration may be different from the amplitude and period of the second vibration, respectively. In an alternative exemplary embodiment, the frequency of the first vibration may be different from the frequency of the second vibration. In an alternative exemplary embodiment, the amplitude of the first vibration may be different from the amplitude of the second vibration.

As described above, the user may feel that the first vibration and the second vibration are different due to a change in at least one of frequency, amplitude and period of the vibration.

Figure 12:
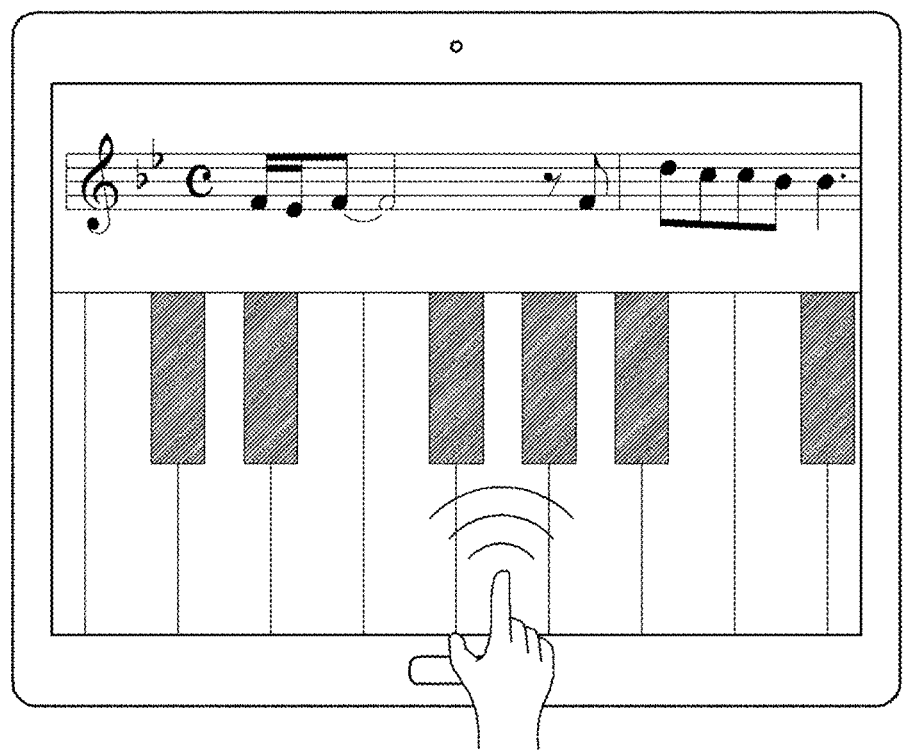
FIG. 12 is a view showing an exemplary embodiment of a screen of the display device where the application for providing the haptic feedback of FIG. 11 is executed.

FIG. 11 is a table showing an exemplary embodiment of a method for providing a haptic feedback by a display device according to the invention. FIG. 11 shows a method for providing a haptic feedback according to a user's touch input when an application for a piano keyboard is running on a display device. FIG. 12 is a view showing an exemplary embodiment of a screen of the display device where the application for providing the haptic feedback of FIG. 11 is executed.

Referring to FIGS. 11 and 12, the display device 10 may provide a user with different haptic feedbacks according to the user's touch input in the application, thereby increasing the user's immersion into the application.

When the user touches a single key in the piano keyboard application, the display device 10 may vibrate the first vibration device 510 with the maximum amplitude of 26 and the frequency of about 78 Hz for about 153 ms. When the user touches two keys simultaneously in the piano keyboard application, the display device 10 may vibrate the first vibration device 510 with the maximum amplitude of 32 and the frequency of about 109 Hz for about 109 ms. When the user touches three keys simultaneously in the piano keyboard application, the display device 10 may vibrate the first vibration device 510 with the maximum amplitude of 45 and the frequency of about 125 Hz for about 96 ms.

According to the exemplary embodiment shown in FIGS. 11 and 12, when the user performs a single touch input, i.e., the user touches a single key on the piano keyboard, the display device 10 may generate a first vibration using the first vibration device 510 to provide a first haptic feedback. In addition, when the user performs a multi-touch input, i.e., the user touches two keys on the piano keyboard simultaneously, the display device 10 may generate a second vibration using the first vibration device 510 to provide a second haptic feedback. In an exemplary embodiment, as shown in FIG. 11, the frequency of the second vibration may be higher than the frequency of the first vibration, and the amplitude of the second vibration may be larger than the amplitude of the first vibration, for example. In such case, when the user performs a second touch input, i.e., the user touches two keys on the piano keyboard simultaneously, the user may feel a stronger vibration than when the user performs the first touch input, i.e., the user touches a single key on the piano keyboard.

Moreover, when the user performs a multi-touch input, i.e., the user touches three keys on the piano keyboard simultaneously, the display device 10 may generate a third vibration using the first vibration device 510 to provide a third haptic feedback. In an exemplary embodiment, as shown in FIG. 11, the frequency of the third vibration may be higher than the frequency of the second vibration, and the amplitude of the third vibration may be larger than the amplitude of the second vibration, for example. In such case, when the user performs a third touch input, i.e., the user touches three keys simultaneously, the user may feel a stronger vibration than when the user performs the second touch input, i.e., the user touches two keys on the piano keyboard.

In the example shown in FIG. 11, the period of the first vibration is longer than the period of the second vibration, and the period of the second vibration is longer than the period of the third vibration. It is, however, to be understood that the invention is not limited thereto. In an exemplary embodiment, the period of the first vibration may be shorter than the period of the second vibration, and the period of the second vibration may be shorter than the period of the third vibration, for example.

As described above, the user may feel that the first vibration, the second vibration and the third vibration are different from one another due to a change in at least one of frequency, amplitude and period of the vibration.

Figure 14:
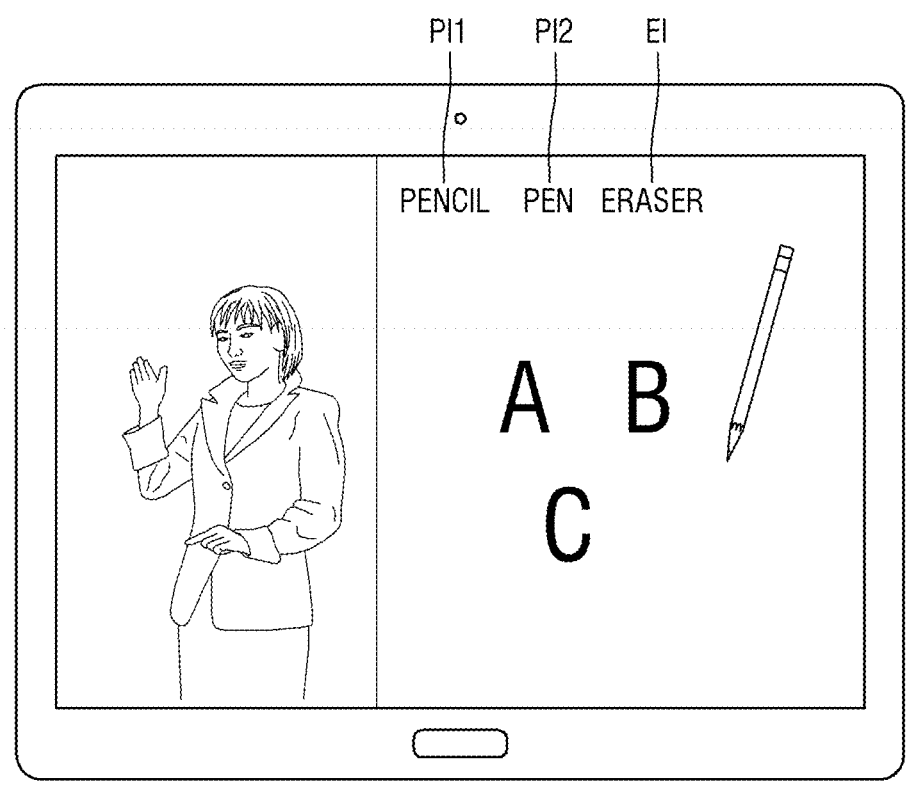
FIG. 14 is a view showing an exemplary embodiment of a screen of the display device where the application for providing the haptic feedback of FIG. 13 is executed.

FIG. 13 is a table showing an exemplary embodiment of a method for providing a haptic feedback by a display device according to the invention. FIG. 13 shows a method for providing a haptic feedback according to a user's touch input when a memo application is running on a display device. FIG. 14 is a view showing an exemplary embodiment of a screen of the display device where the application for providing the haptic feedback of FIG. 13 is executed.

Referring to FIGS. 13 and 14, the display device 10 may provide a user with different haptic feedbacks according to the user's touch input in the application, thereby increasing the user's immersion into the application.

When the user touches a pencil icon PI1 in the memo application, the display device 10 may vibrate the first vibration device 510 with the maximum amplitude of 10 and the frequency of about 218 Hz for about 18 ms. When the user touches a pen icon PI2 in the memo application, the display device 10 may vibrate the first vibration device 510 with the maximum amplitude of 23 and the frequency of about 203 Hz for about 19 ms. When the user touches an eraser EI in the memo application, the display device 10 may vibrate the first vibration device 510 with the maximum amplitude of 36 and the frequency of about 78 Hz for about 51 ms.

According to the exemplary embodiment shown in FIGS. 13 and 14, when the user performs a single touch input, i.e., the user touches the pencil icon PI1, the display device 10 may generate a first vibration using the first vibration device 510 to provide a first haptic feedback. In addition, when the user performs a second touch input, i.e., the user touches the pen icon PI2, the display device 10 may generate a second vibration using the first vibration device 510 to provide a second haptic feedback. Moreover, when the user performs a third touch input, i.e., the user touches the eraser EI, the display device 10 may generate a third vibration using the first vibration device 510 to provide a third haptic feedback. The frequency, amplitude and period of the first vibration, the frequency, amplitude and period of the second vibration, and the frequency, amplitude and period of the third vibration may be different from one another.

As described above, the user may feel that the first vibration, the second vibration and the third vibration are different from one another due to a change in at least one of frequency, amplitude and period of the vibration.

Figure 16:
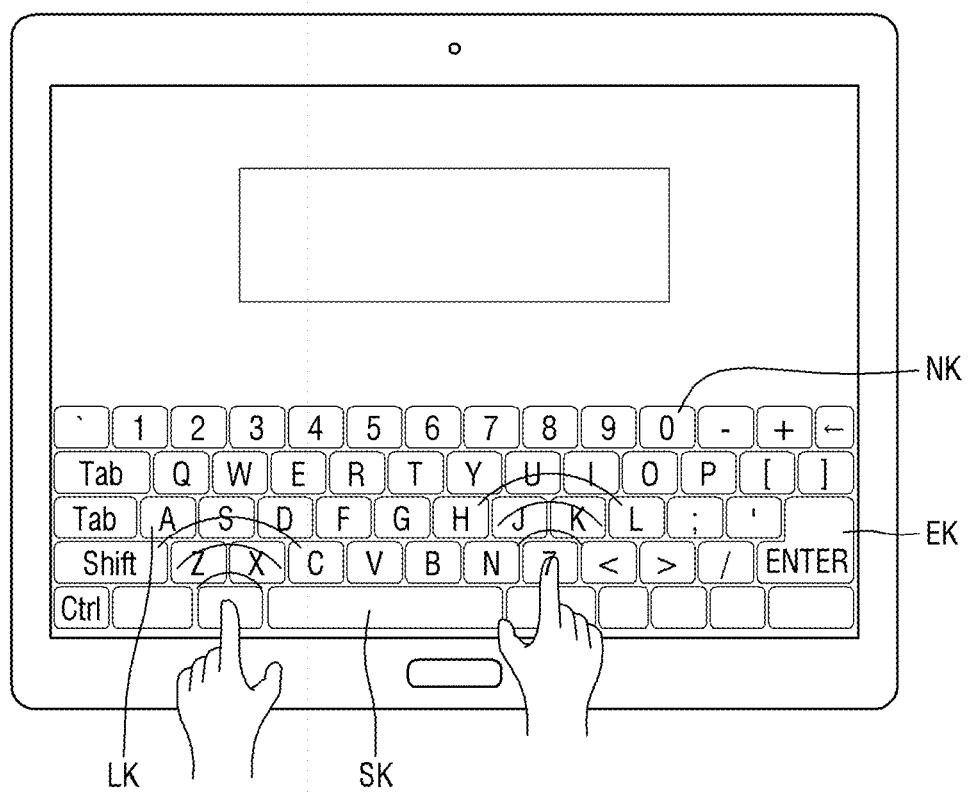
FIG. 16 is a view showing an exemplary embodiment of a screen of a display device where an application for providing the haptic feedback of FIG. 15 is running.

FIG. 15 is a table showing an exemplary embodiment of a method for providing a haptic feedback by a display device according to the invention. FIG. 15 shows a method for providing a haptic feedback according to a user's touch input when a keyboard application is running on a display device. FIG. 16 is a view showing an exemplary embodiment of a screen of a display device where an application for providing the haptic feedback of FIG. 15 is running.

Referring to FIGS. 15 and 16, the display device 10 may provide a user with different haptic feedbacks according to the user's touch input in the application, thereby increasing the user's immersion into the application.

When the user touches an enter key EK or a space key SK in the keyboard application, the display device 10 may vibrate the first vibration device 510 with the maximum amplitude of 97 and the frequency of about 148 Hz for about 26 ms. When the user touches a letter key LK or a number key NK in the keyboard application, the display device 10 may vibrate the first vibration device 510 with the maximum amplitude of 84 and the frequency of about 156 Hz for about 6 ms.

According to the exemplary embodiment shown in FIGS. 15 and 16, when the user performs a first touch input, i.e., the user touches the enter key EK or the space key SK, the display device 10 may generate a first vibration using the first vibration device 510 to provide a first haptic feedback. In addition, when the user performs a second touch input, i.e., the user touches the letter key LK or the number key NK, the display device 10 may generate a second vibration using the first vibration device 510 to provide a second haptic feedback. The frequency, amplitude and period of the first vibration may be different from the frequency, amplitude and period of the second vibration, respectively.

As described above, the user may feel that the first vibration and the second vibration are different due to a change in at least one of frequency, amplitude and period of the vibration.

Figure 18:
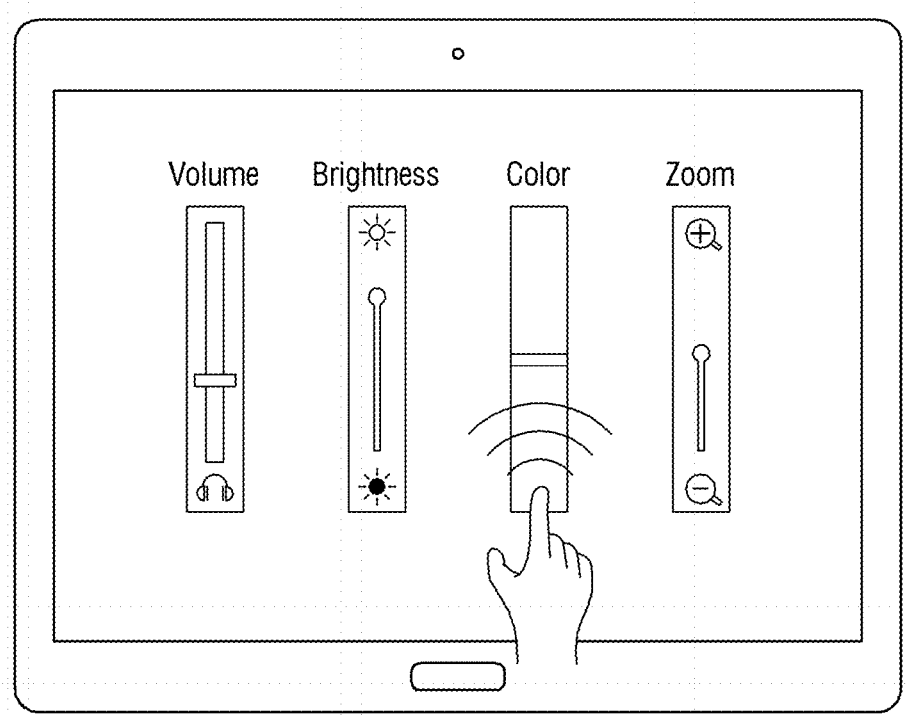
FIG. 18 is a view showing an exemplary embodiment of a screen of a display device where an application for providing the haptic feedback of FIG. 17 is running.

FIG. 17 is a table showing an exemplary embodiment of a method for providing a haptic feedback by a display device according to the invention. FIG. 17 shows a method for providing a haptic feedback according to a user's touch input when a configuration application including volume control, brightness control, color control and zoom control is running on a display device. FIG. 18 is a view showing an exemplary embodiment of a screen of a display device where an application for providing the haptic feedback of FIG. 17 is running.

Referring to FIGS. 17 and 18, the display device 10 may provide a user with different haptic feedbacks according to the user's touch input in the application, thereby increasing the user's immersion into the application.

The configuration application running on the display device 10 allows a user to turn the volume up or down by dragging the volume slider while the first vibration device 510 vibrates as the user adjusts the volume. In an exemplary embodiment, the period of vibration of the first vibration device 510 may range from about 10 to about 25 ms, for example, the maximum amplitude may range from 10 to 60, and the frequency may range from 78 to 195 Hz.

The configuration application running on the display device 10 allows a user to increase or decrease the brightness by dragging the brightness slider while the first vibration device 510 vibrates as the user adjusts the brightness. In an exemplary embodiment, the period of vibration of the first vibration device about 510 may be about 18 ms, for example, the maximum amplitude may range from 15 to 85, and the frequency may be 109 Hz.

The configuration application running on the display device 10 allows a user to change the color by dragging the color slider while the first vibration device 510 vibrates as the user adjusts the color. In an exemplary embodiment, the period of vibration of the first vibration device 510 may be 12 ms, for example, the maximum amplitude may range from 15 to 85, and the frequency may range from about 78 to about 156 Hz.

The configuration application running on the display device 10 allows a user to zoom in or out the image by dragging the zoom slider while the first vibration device 510 vibrates as the user adjusts the zoom. In an exemplary embodiment, the period of vibration of the first vibration device about 510 may be about 16 ms, for example, the maximum amplitude may range from 15 to 40, and the frequency may be 125 Hz.

According to the exemplary embodiment shown in FIGS. 17 and 18, when the user performs a first touch input, i.e., the user drags the volume slider, the display device 10 may generate a first vibration using the first vibration device 510 to provide a first haptic feedback. In addition, when the user performs a second touch input, i.e., the user drags the brightness slider, the display device 10 may generate a second vibration using the first vibration device 510 to provide a second haptic feedback. Moreover, when the user performs a third touch input, i.e., the user drags the color slider, the display device 10 may generate a third vibration using the first vibration device 510 to provide a third haptic feedback.

Moreover, when the user drags a fourth touch input, i.e., the user drags the zoom slider, the display device 10 may generate a fourth vibration using the first vibration device 510 to provide a fourth haptic feedback. The frequency, amplitude and period of the first vibration, the frequency, amplitude and period of the second vibration, the frequency, amplitude and period of the third vibration, and the frequency, amplitude and period of time of the fourth vibration may be different from one another.

As described above, the user may feel that the first vibration, the second vibration, the third vibration and the fourth vibration are different from one another due to a change in at least one of frequency, amplitude and period of the vibration.

Figure 20:
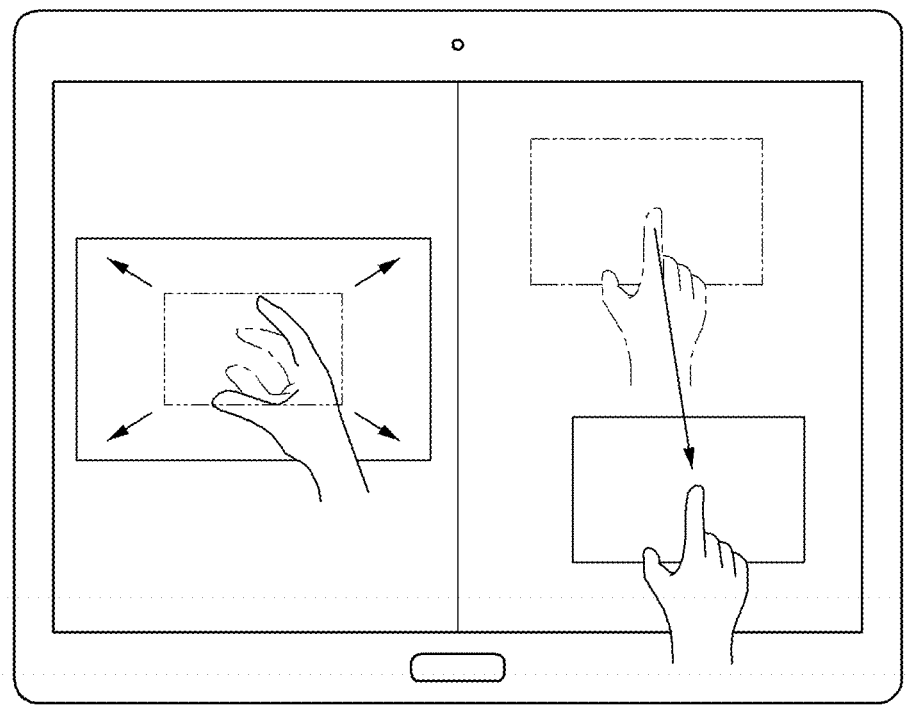
FIG. 20 is a view showing an exemplary embodiment of a screen of a display device where an application for providing the haptic feedback of FIG. 19 is running.

FIG. 19 is a table showing an exemplary embodiment of a method for providing a haptic feedback by a display device according to the invention. FIG. 19 shows a method for providing a haptic feedback according to a user's touch input when an image edition application is running on a display device. FIG. 20 is a view showing an exemplary embodiment of a screen of a display device where an application for providing the haptic feedback of FIG. 19 is running.

Referring to FIGS. 19 and 20, the display device 10 may provide a user with different haptic feedbacks according to the user's touch input in the application, thereby increasing the user's immersion into the application.

When a user touches the screen with two fingers and spread the fingers to magnify an image in the image edition application, the display device 10 may vibrate the first vibration device 510 with the maximum amplitude of 66 and the frequency of about 195 Hz for about 10 ms. When a user touches the screen with two fingers and pinch the fingers together to reduce an image in the image edition application, the display device 10 may vibrate the first vibration device 510 with the maximum amplitude of 60 and the frequency of about 125 Hz for about 16 ms.

In addition, when a user drags an image toward the upper side in the image edition application, the display device 10 may vibrate the first vibration device 510 with the maximum amplitude of 34 and the frequency of about 125 Hz for about 144 ms. In doing so, the first vibration device 510 may vibrate with the amplitude increasing over the period of about 128 ms for about 144 ms. In addition, when a user drags an image toward the lower side in the image edition application, the display device 10 may vibrate the first vibration device 510 with the maximum amplitude of 34 and the frequency of about 125 Hz for about 144 ms. In doing so, the first vibration device 510 may vibrate with the amplitude decreasing over the period of about 124 ms for about 144 ms. According to the exemplary embodiment shown in FIGS. 19 and 20, when the user performs a first touch input, i.e., the user spreads two fingers to magnify an image, the display device 10 may generate a first vibration using the first vibration device 510 to provide a first haptic feedback. In addition, when the user performs a second touch input, i.e., the user pinches two fingers to reduce an image, the display device 10 may generate a second vibration using the first vibration device 510 to provide a second haptic feedback. Moreover, when the user performs a third touch input, i.e., the user drags an image toward the upper side, the display device 10 may generate a third vibration using the first vibration device 510 to provide a third haptic feedback. Moreover, when the user drags a fourth touch input, i.e., the user drags an image toward the lower side, the display device 10 may generate a fourth vibration using the first vibration device 510 to provide a fourth haptic feedback. The frequency, amplitude and period of the first vibration, the frequency, amplitude and period of the second vibration, the frequency, amplitude and period of the third vibration, and the frequency, amplitude and period of time of the fourth vibration may be different from one another.

As described above, the user may feel that the first vibration, the second vibration, the third vibration and the fourth vibration are different from one another due to a change in at least one of frequency, amplitude and period of the vibration.

Figure 21:
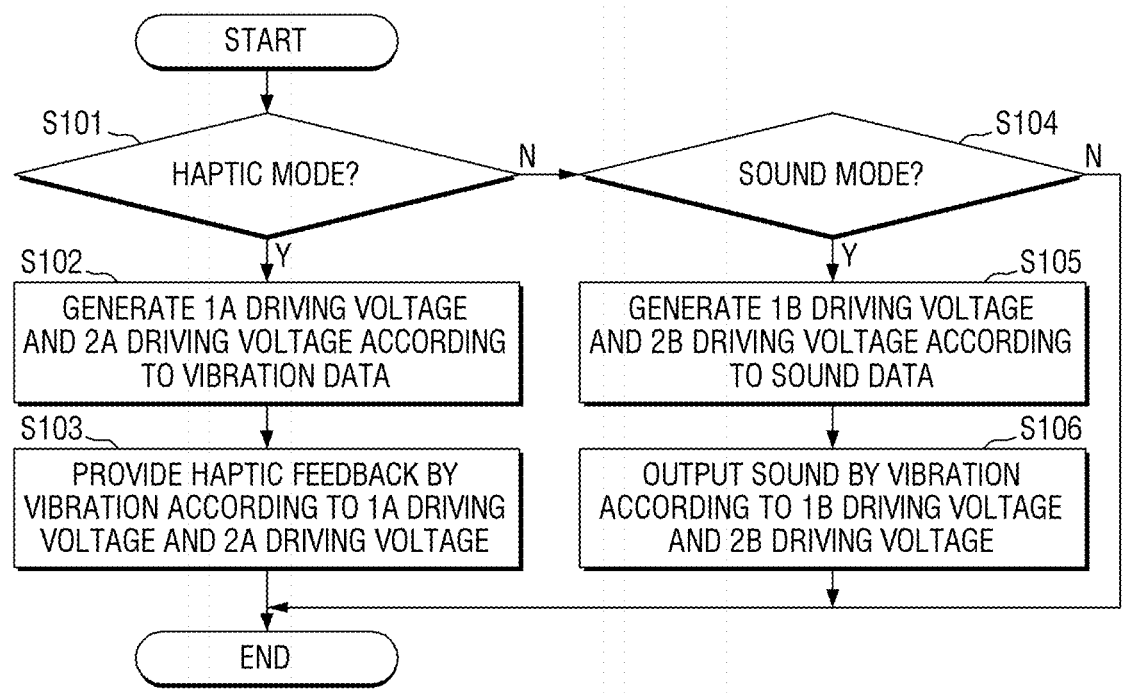
FIG. 21 is a flowchart for illustrating an exemplary embodiment of a haptic mode and a sound mode of a display device according to the invention.

FIG. 21 is a flowchart for illustrating an exemplary embodiment of a haptic mode and a sound mode of a display device according to the invention.

Referring to FIG. 21, the display device 10 may provide a haptic feedback in a haptic mode and may output a sound in a sound mode using the vibration device 510.

Firstly, the main processor 710 may output operation information to the memory 740 which is to be executed by a user's touch input or proximity input and may receive vibration data associated with the operation information from the memory 740 in the haptic mode. The main processor 710 may output the vibration data to the vibration driver 340 in the haptic mode.

The vibration driver 340 may generate a 1A driving voltage and a 2A driving voltage according to the vibration data in the haptic mode. In an exemplary embodiment, the vibration driver 340 may include a digital signal processor ("DSP") for processing the vibration data, which is a digital signal, a digital-analog converter ("DAC") for converting the vibration data output from the digital signal processor into the 1A driving voltage and the 1B driving voltage in the form of analog signal, and an amplifier ("AMP") for amplifying the 1A driving voltage and the 1B driving voltage to output them. The vibration driver 340 may output the 1A driving voltage and the 2A driving voltage to the first vibration device 510 (operations 5101 and 5102 of FIG. 21).

Secondly, the first vibration device 510 provides a haptic feedback in the haptic mode by vibrating according to the 1A driving voltage and the 2A driving voltage. Since the first vibration device 510 is attached to the display panel 300, the display panel 300 may vibrate by the vibration of the first vibration device 510. The frequency of the vibration of the first vibration device 510 may vary depending on the alternating frequency of the 1A driving voltage and the 2A driving voltage. The amplitude thereof may vary depending on the magnitude of the 1A driving voltage and the 2A driving voltage. The period thereof may vary depending on the 1A driving voltage and the 2A driving voltage. The vibration of the first vibration device 510 may vary by adjusting the frequency, amplitude and period according to the 1A driving voltage and the 2A driving voltage (operation S103 of FIG. 21).

Thirdly, the main processor 710 receives sound source data from an external device in the sound mode. The main processor 710 may generate sound data for generating first and second driving voltages to drive the vibration device 510 based on the sound source data in the sound mode. In an alternative exemplary embodiment, the main processor 710 may output the frequency information of the sound source data in the sound mode to the memory 740, and may receive the sound data corresponding to the frequency information of the sound source data from the memory 740. The main processor 710 may output sound data to the vibration driver 340 in the sound mode. While the vibration data may include data of a predetermined frequency, the sound data may include data of a plurality of frequencies.

The vibration driver 340 may generate a 1B driving voltage and a 2B driving voltage according to the sound data in the sound mode. The vibration driver 340 may output the 1B driving voltage and the 2B driving voltage to the first vibration device 510 (operations 5104 and 5105 of FIG. 21).

Fourthly, the first vibration device 510 outputs sound by vibrating according to the 1B driving voltage and the 2B driving voltage in the sound mode. Since the first vibration device 510 is attached to the display panel 300, the display panel 300 may vibrate by the vibration of the first vibration device 510. That is to say, the display panel 300 may be used as a vibrating plane for outputting sound (operation S106 of FIG. 21).

According to the exemplary embodiment shown in FIG. 21, the display device 10 may provide a haptic feedback in the haptic mode and may output a sound in the sound mode using the vibration device 510.

In addition, the display device 10 may simultaneously execute the sound mode and the haptic mode using the first vibration device 510. In such case, the main processor 710 may output summation data obtained by summing the sound data and the vibration data to the vibration driver 340. The vibration driver 340 may generate summation driving voltages according to the summation data, to output them to the first vibration device 510. The first vibration device 510 may vibrate according to the summation driving voltages to simultaneously provide a sound and a haptic feedback to the user.

Figure 22:
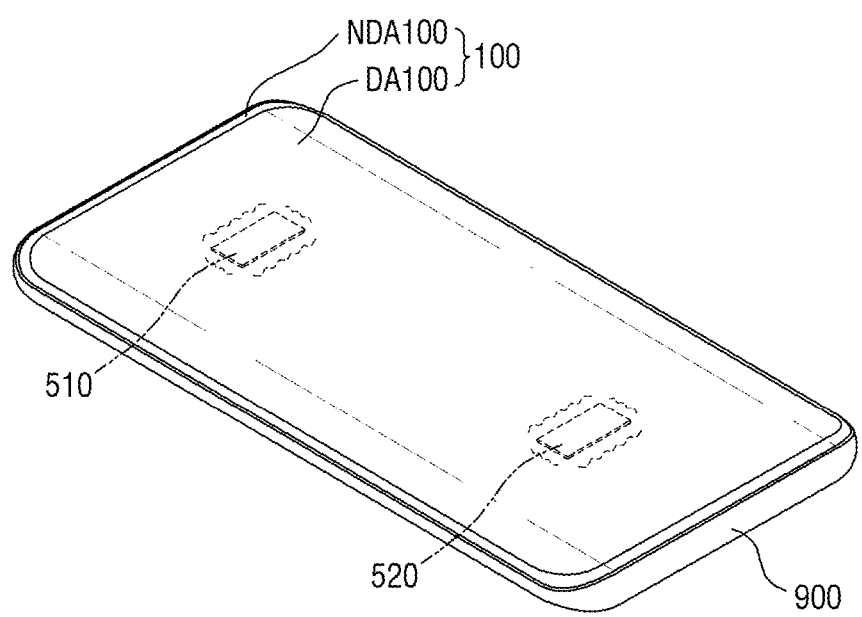
FIG. 22 is a bottom view showing an exemplary embodiment of the display panel attached to the cover window of FIG. 2.

FIG. 22 is a bottom view showing an exemplary embodiment of the display panel attached to the cover window of FIG. 2.

The exemplary embodiment shown in FIG. 22 is different from the exemplary embodiment shown in FIGS. 3A and 3B in that a second vibration device 520 is disposed on a surface of the display panel 300. The elements of FIG. 22 identical to those of FIGS. 3A and 3B will not be described to avoid redundancy.

Referring to FIG. 22, the second vibration device 520 may be attached to a surface of the display panel 300 using an adhesive member 610 such as a pressure-sensitive adhesive. When the cover panel member 400 is disposed on the surface of the display panel 300, the second vibration device 520 may be attached to the cover panel member 400 through the adhesive member 610.

The second vibration device 520 may be a piezoelectric element or a piezoelectric actuator including a piezoelectric material that contracts or expands according to a voltage applied thereto. Although the second vibration device 520 has a cuboid shape in FIG. 22, the invention is not limited thereto. The first vibration device 510 may be disposed adjacent to the upper side of the display panel 300, while the second vibration device 520 may be disposed adjacent to the lower side of the display panel 300.

A third connector 317 may be disposed on the surface of the display circuit board 310. The third connector 317 may include an insertion portion connected to a connection terminal disposed at one end of the second flexible circuit board 580.

The connection terminal provided at one end of the second flexible circuit board 580 may be inserted into the insertion portion of the third connector 317. The other end of the second flexible circuit board 580 may be connected to the second vibration device 520. In an exemplary embodiment, the second flexible circuit board 580 may be an FPCB or an FPC, for example.

Figure 23:
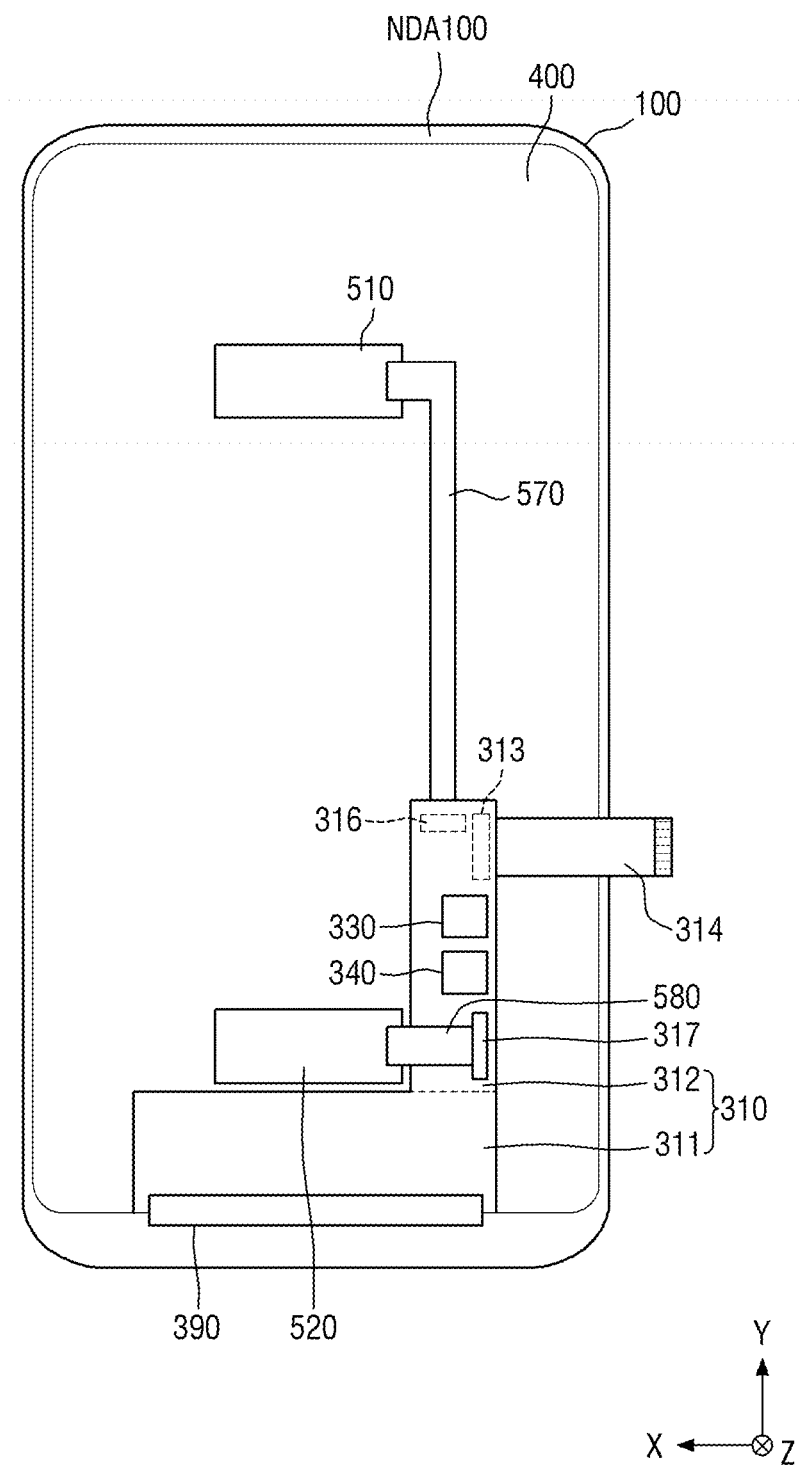
FIG. 23 is a perspective view of a display device showing an exemplary embodiment of a multi-haptic feedback.

According to the exemplary embodiment shown in FIG. 22, it is possible to output the haptic feedback and sound using the second vibe device 520 as well as the first vibration device 510. Therefore, it is possible to prevent provide the haptic feedback by the first vibration device 510 and the second vibration device 520 as shown in FIG. 23.

Figure 24:
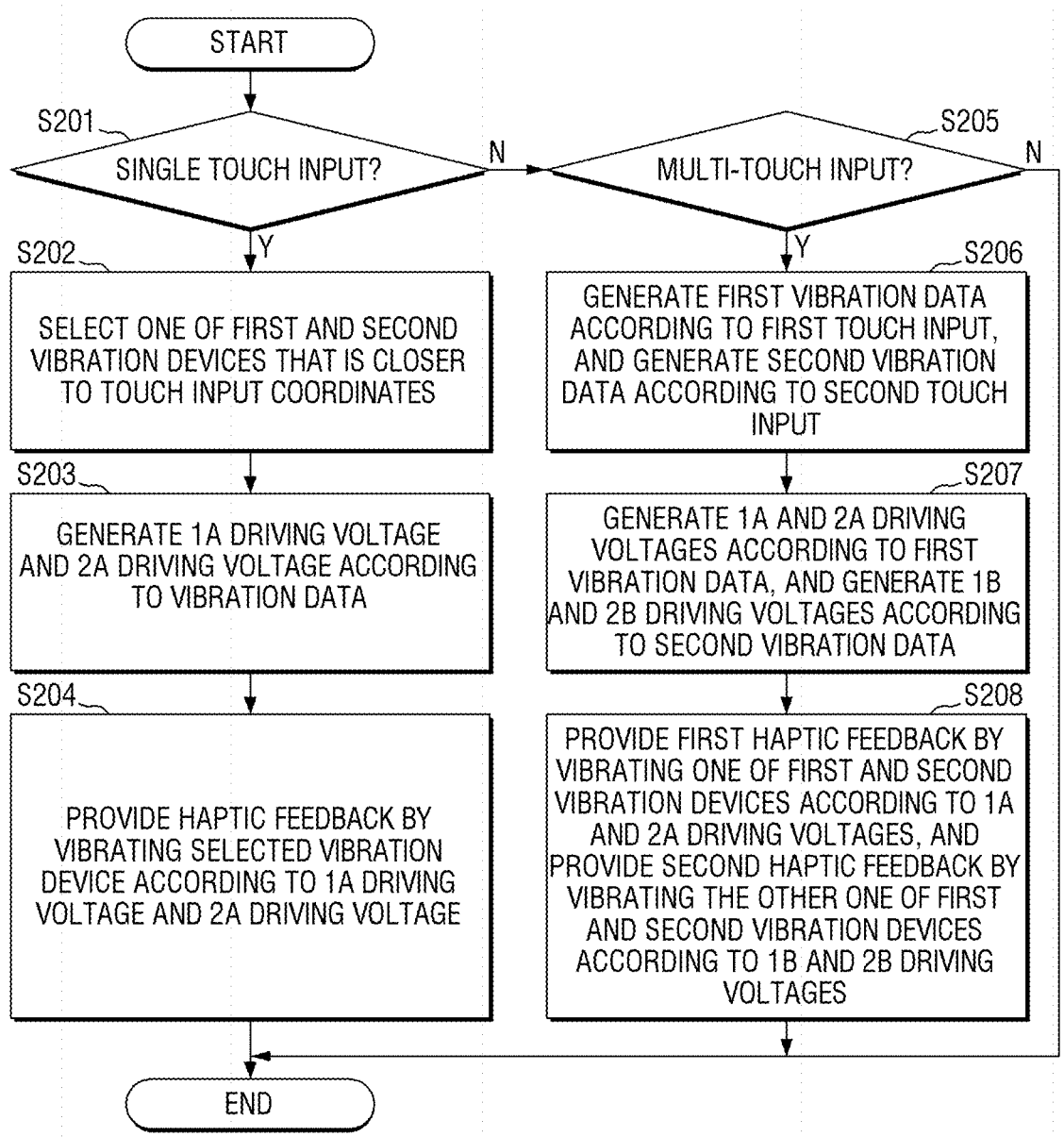
FIG. 24 is a flowchart for illustrating an exemplary embodiment of a haptic mode of a display device according to the invention.

Firstly, when a single touch input is sensed, the display device 10 may display a haptic feedback using one of the first vibration device 510 and the second vibration device 520 that is closer to touch coordinates of the single touch input (operations 5201 to 5204 in FIG. 24).

Specifically, when a single touch input is sensed, the main processor 710 determines which one of the first vibration device 510 and the second vibration device 520 is closer to the touch coordinates and selects the closer one. The main processor 710 may output operation information to the memory 740 which is to be executed by a user's touch input or proximity input and may receive vibration data corresponding to the operation information from the memory 740. The main processor 710 may output the vibration data to the vibration driver 340.

The vibration driver 340 may generate a 1A driving voltage and a 2A driving voltage according to the vibration data. The vibration driver 340 may output the 1A driving voltage and the 2A driving voltage to the selected one of the first and second vibration devices 510 and 520.

In the haptic mode, the selected vibration device vibrates according to the 1A driving voltage and the 2A driving voltage to provide a haptic feedback. As the haptic feedback is provided from the vibration device closer to the user's touch coordinates, the quality of the tactile feedback felt by the user may be further improved.

Secondly, when a multi-touch input is sensed which includes multiple touch inputs generating simultaneously, the display device 10 may provide a first haptic feedback using the first vibration device 510 as well as a second haptic feedback using the second vibration device 520 (operations 5205 to 5208 of FIG. 24).

Specifically, when a multi-touch input is sensed, the main processor 710 may output first operation information to the memory 740 which is to be executed by a user's first touch input or first proximity input and may receive vibration data corresponding to the first operation information from the memory 740. The main processor 710 may output second operation information to the memory 740 which is to be executed by a user's second touch input or second proximity input and may receive vibration data associated with the second operation information from the memory 740 in the haptic mode. In the haptic mode, the main processor 710 may output the vibration data corresponding to the first operation information to the vibration driver 340 and may output the vibration data corresponding to the second operation information to the second vibration data to the vibration driver 340.

The vibration driver 340 may generate the 1A driving voltage and the 2A driving voltage according to the first vibration data and may generate the 1B driving voltage and the 2B driving voltage according to the second vibration data. The vibration driver 340 outputs the 1A driving voltage and the 2A driving voltage to the first vibration device 510 and outputs the 1B driving voltage and the 2B driving voltage to the second vibration device 520.

The main processor 710 may determine which one of the first vibration device 510 and the second vibration device 520 is closer to the first touch coordinates associated with the first touch input or the first proximity input and the second touch coordinates associated with the second touch input or the second proximity input. Accordingly, the vibration driver 340 may output the 1A driving voltage and the 2A driving voltage according to the first vibration data to the vibration device closer to the first touch coordinates, and may output the 1B driving voltage and the 2B driving voltage according to the second vibration data to the vibration device closer to the second touch coordinates. In such case, since the first haptic feedback is provided by the vibration device closer to the first touch coordinates and the second haptic feedback is provided by the vibration device closer to the second touch coordinates, the quality of the tactile feedback felt by the user may be further improved.

Figure 25:
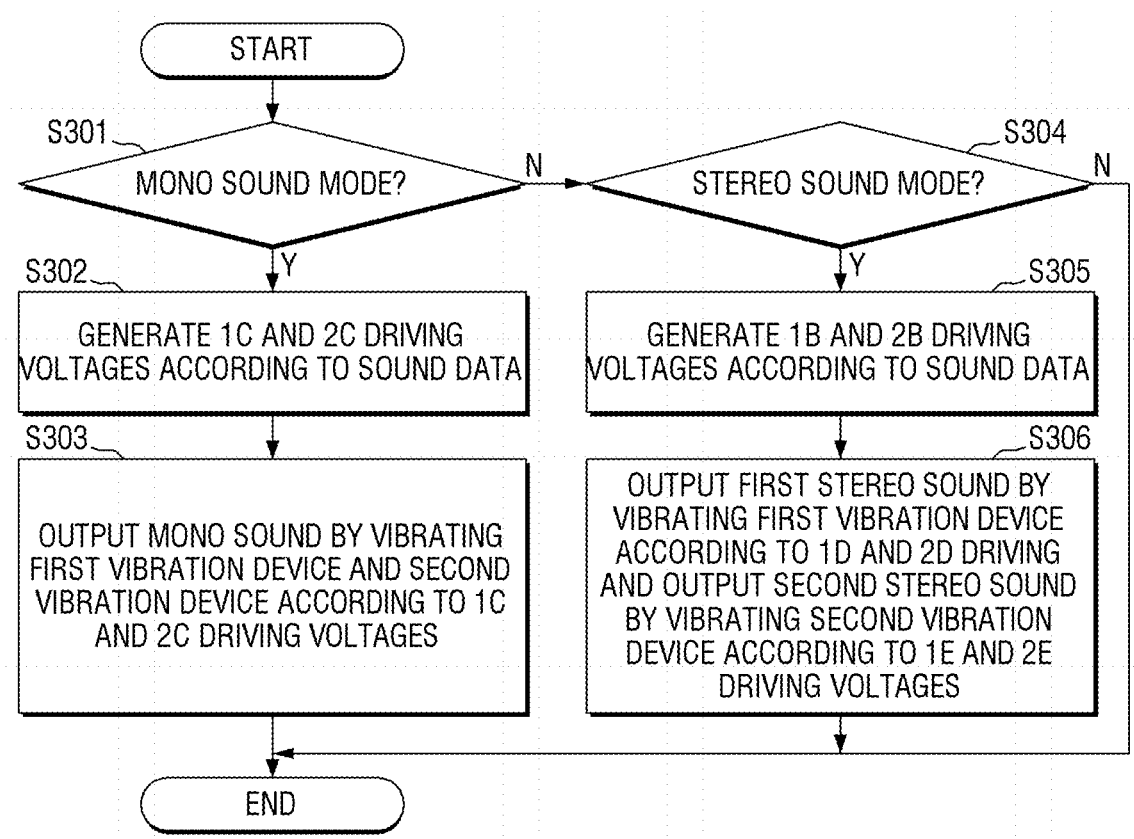
FIG. 25 is a flowchart for illustrating an exemplary embodiment of a sound mode of a display device according to the invention.

Thirdly, the display device 10 may output a mono sound using the first vibration device 510 and the second vibration device 520 in a mono sound mode (operations 5301 to S303 in FIG. 25).

Specifically, the main processor 710 receives sound source data from an external device in the mono sound mode. The main processor 710 may generate mono sound data for generating first and second driving voltages for driving the first vibration device 510 and the second vibration device 520 based on the sound source data in the mono sound mode. In an alternative exemplary embodiment, the main processor 710 may output the frequency information of the sound source data in the mono sound mode to the memory 740, and may receive the sound data corresponding to the frequency information of the sound source data from the memory 740. The main processor 710 may output the mono sound data to the vibration driver 340 in the mono sound mode.

The vibration driver 340 may generate a 1C driving voltage and a 2C driving voltage according to the mono sound data in the mono sound mode. The vibration driver 340 outputs the 1C driving voltage and the 2C driving voltage to the first vibration device 510 and the second vibration device 520.

Each of the first vibration device 510 and the second vibration device 520 outputs sound by vibrating according to the 1C driving voltage and the 2C driving voltage in the mono sound mode. Since the first vibration device 510 and the second vibration device 520 output the same sound, the display device 10 may output a mono sound.

Fourthly, the display device 10 may output a stereo sound using the first vibration device 510 and the second vibration device 520 in a stereo sound mode (operations 5304 to S306 in FIG. 25).

Specifically, the main processor 710 receives sound source data including first stereo source data and second stereo source data from an external device in the stereo sound mode. The main processor 710 may generate first stereo sound data for generating the first and second driving voltages for driving the first vibration device 510 and second stereo sound data for generating the first and second driving voltages for driving the second vibration device 510 based on the first stereo source data in the stereo sound mode.

In an alternative exemplary embodiment, the main processor 710 may output the frequency information of the first stereo source data to the memory 740 and may receive the first stereo sound data associated with the frequency information of the first stereo source data from the memory 740 in the stereo sound mode. The main processor 710 may output the frequency information of the second stereo source data to the memory 740 and may receive the second stereo sound data associated with the frequency information of the second stereo source data from the memory 740 in the stereo sound mode.

The main processor 710 may output the first stereo sound data and the second stereo sound data to the vibration driver 340 in the stereo sound mode.

The vibration driver 340 may generate a 1D driving voltage and a 2D driving voltage in accordance with the first stereo sound data in the stereo sound mode. The vibration driver 340 outputs the 1D driving voltage and the 2D driving voltage to the first vibration device 510.

The vibration driver 340 may generate a 1E driving voltage and a 2E driving voltage in accordance with the second stereo sound data in the stereo sound mode. The vibration driver 340 outputs the 1E driving voltage and the 2E driving voltage to the second vibration device 520.

In the stereo sound mode, the first vibration device 510 vibrates according to the 1D driving voltage and the 2D driving voltage to output the first stereo sound, and the second vibration device 520 vibrates according to a 1E driving voltage and a 2E driving voltage to output the second stereo sound.

According to the exemplary embodiment shown in FIG. 22, the display device 10 may provide a haptic feedback in the haptic mode using the first vibration device 510 and the second vibration device 520, may output a mono sound in mono sound mode, and may output a stereo sound in the stereo sound mode.

The invention should not be construed as being limited to the exemplary embodiments set forth herein. Rather, these embodiments are provided so that this invention will be thorough and complete and will fully convey the concept of the invention to those skilled in the art.

While the invention has been particularly shown and described with reference to exemplary embodiments thereof, it will be understood by those of ordinary skill in the art that various changes in form and details may be made therein without departing from the spirit or scope of the invention as defined by the following claims.

What is claimed is:

1. A display device comprising:
a display panel;
a touch sensing layer which senses a touch input of a user;
a first vibration device which is disposed on a first surface of the display panel and generates vibration according to driving voltages,
wherein the first vibration device generates a first vibration during a first situation, and the first vibration device generates a second vibration during a second situation,
wherein the number of times of increasing the amplitude of the first vibration is N where N is a positive integer, and the number of times of decreasing the amplitude of the first vibration is M where M is a positive integer,
wherein a time period of duration of the first vibration is different than a time period of duration of the second vibration, and
wherein the first vibration device generates a third vibration in response to touch a first icon, and the first vibration device generates a fourth vibration in response to touch a second icon,
wherein a frequency of the third vibration and a frequency of the fourth vibration is larger than a frequency of the second vibration.

2. The display device of claim 1, wherein the amplitude of the first vibration increases to a same level at the equal interval and decreases to the same level at the equal interval.

3. The display device of claim 1, wherein the time period of duration of the second vibration is longer than the time period of duration of the first vibration, and
wherein a frequency of the first vibration is lower than a frequency of the second vibration.

4. The display device of claim 1, wherein the number of times of increasing the amplitude of the first vibration is P where P is a positive integer, and the number of times of decreasing the amplitude of the first vibration is Q where Q is a positive integer.

5. The display device of claim 1, wherein the first vibration device generates a fifth vibration in response to a first situation, and the first vibration device generates a sixth vibration in response to a second situation, and the first vibration device generates a seventh vibration in response to a third situation,
wherein a frequency of the fifth vibration is larger than a frequency of a sixth vibration, and the frequency of the sixth vibration is larger than a frequency of a seventh vibration, and
wherein a time period of duration of the fifth vibration is smaller than a time period of duration of the sixth vibration, and the time period of duration of the sixth vibration is smaller than a time period of duration of the seventh vibration.

6. A display device comprising:
a display panel;
a touch sensing layer which senses a touch input of a user;
a first vibration device which is disposed on a first surface of the display panel and generates vibration according to driving voltages,
wherein the first vibration device generates a first vibration in response to touch a first icon, and the first vibration device generates a second vibration in response to touch a second icon, and the first vibration device generates a third vibration in response to touch a third icon,
wherein
a difference between a frequency of the first vibration and a frequency of the second vibration is smaller than a difference between a frequency of the third vibration and the frequency of the second vibration, and
wherein a difference between an amplitude of the first vibration and an amplitude of the second vibration is equal to a difference between an amplitude of the third vibration and the amplitude of the second vibration.

7. A display device comprising:
a display panel;
a touch sensing layer which senses a touch input of a user;
a first vibration device which is disposed on a first surface of the display panel and generates vibration according to driving voltages,
wherein the first vibration device generates a first vibration in response to drag a first slider, and the first vibration device generates a second vibration in response to drag a second slider, and the first vibration device generates a third vibration in response to drag a third slider, and wherein a frequency of the first vibration varies according to dragging the first slider, wherein a minimum frequency of the first vibration is smaller than a frequency of the second vibration, and a maximum frequency of the first vibration is larger than the frequency of the second vibration, and wherein a time period of duration of the first vibration varies according to dragging the first slider, and wherein the frequency of the first vibration is associated with the drag of the first slider, and a frequency of the third vibration is associated with the drag of the third slider, and the frequency of the second vibration is not associated with the drag of the second slider, and wherein an amplitude of the first vibration is associated with the drag of the first slider, and an amplitude of the second vibration is associated with the drag of the second slider, and an amplitude of the third vibration is associated with the drag of the third slider, and the frequency, and wherein the time period of duration of the first vibration is associated with the drag of the first slider, and a time period of duration of the third vibration is associated with the drag of the third slider, and a time period of duration of the second vibration is not associated with the drag of the second slider.

8. The display device of claim 7, wherein an amplitude of the first vibration varies according to dragging the first slider, and an amplitude of the second vibration varies according to dragging the second slider, and wherein a minimum amplitude of the first vibration is smaller than a minimum amplitude of the second vibration.

9. The display device of claim 8, wherein a maximum amplitude of the first vibration is equal to a maximum amplitude of the second vibration.

10. The display device of claim 8, wherein a minimum time period of duration of the first vibration is smaller than a time period of duration of the second vibration, and a maximum time period of duration of the first vibration is larger than the time period of duration of the second vibration.

11. A display device comprising:

a display panel;

a touch sensing layer which senses a touch input of a user;

a first vibration device which is disposed on a first surface of the display panel and generates vibration according to driving voltages, wherein the first vibration device generates a first vibration in response to magnifying an image, and the first vibration device generates a second vibration in response to reducing the image, wherein a frequency of the first vibration is larger than a frequency of the second vibration, and wherein an amplitude of the first vibration is larger than an amplitude of the second vibration, and wherein a time period of duration of the first vibration is smaller than a time period of duration of the second vibration, wherein the first vibration device generates a third vibration in response to dragging the image toward an upper side, and wherein an amplitude of the third vibration is smaller than an amplitude of the second vibration, and wherein a time period of duration of the third vibration is larger than a time period of duration of the second vibration.

12. The display device of claim 11, wherein the first vibration device generates a fourth vibration in response to dragging the image toward a lower side, and wherein a frequency of the fourth vibration is equal to a frequency of the third vibration and a frequency of the second vibration, and wherein an amplitude of the fourth vibration is equal to an amplitude of the third vibration, and wherein a time period of duration of the fourth vibration is equal to a time period of duration of the third vibration.

* * * * *